(12) United States Patent
Terazawa et al.

(10) Patent No.: US 7,755,530 B2
(45) Date of Patent: Jul. 13, 2010

(54) ANALOG TO DIGITAL CONVERTER WITH A SERIES OF DELAY UNITS

(75) Inventors: Tomohito Terazawa, Gifu (JP); Takamoto Watanabe, Nagoya (JP)

(73) Assignee: Denso Corporation, Kariya (JP)

( * ) Notice: Subject to any disclaimer, the term of this patent is extended or adjusted under 35 U.S.C. 154(b) by 41 days.

(21) Appl. No.: 12/218,531

(22) Filed: Jul. 16, 2008

(65) Prior Publication Data

US 2009/0021407 A1    Jan. 22, 2009

(30) Foreign Application Priority Data

Jul. 17, 2007    (JP) .............................. 2007-185928

(51) Int. Cl.
*H03M 1/60*    (2006.01)

(52) U.S. Cl. ........................ 341/157; 314/155; 314/156

(58) Field of Classification Search .......... 341/155–157
See application file for complete search history.

(56) References Cited

U.S. PATENT DOCUMENTS

| | | | |
|---|---|---|---|
| 5,396,247 A | 3/1995 | Watanabe et al. | |
| 5,416,444 A | 5/1995 | Yamauchi et al. | |
| 5,528,200 A | 6/1996 | Yamauchi et al. | |
| 5,818,797 A * | 10/1998 | Watanabe et al. | 368/113 |
| 6,411,241 B1 * | 6/2002 | Taketoshi | 341/155 |
| 6,476,749 B1 * | 11/2002 | Yeap et al. | 341/155 |
| 6,771,202 B2 | 8/2004 | Watanabe et al. | |
| 6,879,278 B2 | 4/2005 | Watanabe et al. | |

FOREIGN PATENT DOCUMENTS

| | | |
|---|---|---|
| JP | 05-259907 | 10/1993 |
| JP | 06-216721 | 8/1994 |
| JP | 2004-007385 | 1/2004 |
| JP | 2004-357030 | 12/2004 |

\* cited by examiner

*Primary Examiner*—Jean B Jeanglaude
(74) *Attorney, Agent, or Firm*—Harness, Dickey & Pierce, PLC

(57) ABSTRACT

An A/D converter has a series of M delay units through which a pulse signal is transmitted while being delayed in each delay unit by a delay time depending on a level of an analog signal. A unit of the converter latches the pulse signal outputted from each delay unit at N sampling times to hold M×N latched data. Another unit of the converter receives the M×N pieces of latched data as a piece of combined data composed of the latched data arranged in an order corresponding to an arranging order of M×N sampling points in the pulse signal, converts the combined data into numeral data, corresponding to a position of the pulse signal in the delay units, at one time, and produces converted digital data corresponding to the level of the analog signal from the numeral data.

19 Claims, 25 Drawing Sheets

ANALOG TO DIGITAL CONVERTER WITH A SERIES OF DELAY UNITS

CROSS-REFERENCE TO RELATED APPLICATION

This application is based upon and claims the benefit of priority of the prior Japanese Patent Application 2007-185928 filed on Jul. 17, 2007, so that the contents of which are incorporated herein by reference.

BACKGROUND OF THE INVENTION

1. Field of the Invention

The present invention relates to a TAD (time analog/digital) type analog-to-digital (A/D) converter which converts a voltage level of an analog input signal into one numeral value by using only digital circuits.

2. Description of Related Art

A TAD type A/D converter having only digital circuits has been proposed. For example, Published Japanese Patent First Publication No. H05-259907 discloses an A/D converter wherein a voltage level of an analog input signal is converted into numerical digital data. This converter has a pulse delay circuit with a plurality of delay units. The delay units simultaneously receive the analog input signal, so that the delay units have the same delay time depending on the voltage level of the analog input signal. That is, the delay time is changed with the voltage level. A pulse signal passes through a signal line connecting the delay units in series while being delayed in each delay unit by the delay time, and the number of delay units through which the pulse signal passes within a predetermined measuring time is calculated from the position of the pulse signal in the pulse delay circuit. The converter outputs numerical digital data corresponding to the calculated number of delay units as A/D converted data.

Further, a TAD type A/D converter outputting A/D converted data at high resolution has been required to convert a voltage level of an analog input signal into digital data with high precision. For example, Published Japanese Patent First Publication No. 2004-7385 discloses an A/D converter wherein a voltage level of an analog input signal is converted into numerical digital data at a resolution higher than that corresponding to the delay time of one delay unit, without shortening the delay time. That is, the resolution error in the digital data is set to be smaller than the change of the voltage level in one delay time.

A schematic block diagram of the A/D converter disclosed in the Publication No. 2004-7385 is shown FIG. 1. As shown in FIG. 1, an A/D converter 101 has a pulse delay circuit 102 with M (M is an integer equal to or larger than 2) delay units, N (N is an integer equal to or larger than 2) coding circuits 103, N latch circuits 109, and an adding circuit 110. The delay units of the delay circuit 102 simultaneously receive an analog input signal. A pulse signal passes through a series of delay units while being delayed in each delay unit by a delay time Td. The delay units have the same delay time, and the delay time Td corresponds to the voltage level of the analog input signal. The pulse signal outputted from the i-th (i=1, 2, - - - , M) delay unit is delayed by the delay time Td from the pulse signal outputted from the (i−1)-th delay unit.

N sampling clocks CK1, CK2, - - - , CK$_N$ are inputted to the N coding circuits 103, respectively. Each sampling clock has a pulse every sampling period Ts. The phase of the sampling clock CKj (j=1, 2, - - - , N) is shifted by a shift time Td/N from the phase of the sampling clock CKj−1. The j-th coding circuit 103 latches the pulse signal PA delayed in each delay unit in synchronization with the leading or trailing edge of the clock CKj every sampling period Ts and converts M latched values of the signal PA into numeral data DTj composed of the M values arranged in series.

A system clock CKS is inputted to the coding circuits 103, the latch circuits 109 and the adding circuit 110. The system clock CKS has a pulse every sampling period Ts. In synchronization with each leading or trailing edge of the system clock CKS, the j-th coding circuit 103 outputs the numeral data DTj, and the j-th latch circuit 109 latches the numeral data DTj and outputs the numeral data DTj to the adding circuit 110. The adding circuit 110 calculates the sum of the numeral data DT1 to DT$_N$ as A/D converted data DT. The data DT corresponds to the voltage level of the analog input signal.

A schematic block diagram of the adding circuit 110 is shown in FIG. 2. As shown in FIG. 2, the adding circuit 110 has a binary tree structure classified into P stages (P=[log$_2$N]; [X] indicates a value obtained by raising a fraction Fx of the value X, [X]=X+1−Fx when Fx>0, [X]=X when Fx=0). In this prior art, N=2$^P$ is satisfied. On the k-th stage (k=1, 2, - - - , P), there are N/2$^k$ (=2$^{P-k}$) adder units. The units are hierarchally connected with one another. Each adder unit of the k-th stage has an adder ADD and a latch circuit LT. The adder ADD of the k-th stage calculates a sum of two pieces of numeral data received from the (k−1)-stage, and the latch circuit LT latches the sum in response to the system clock CKS and outputs the sum to one adder ADD of the (k+1)-th stage as numeral data. Therefore, the A/D converted data DT is finally outputted from the latch circuit LT of the P-th stage.

Therefore, as compared with a case where A/D converted data is obtained only from the numeral data DT1 in the same manner as in the A/D converter disclosed in Publication No. H05-259907, the A/D converter 101 can convert the voltage level of the analog input signal into the digital data at a higher resolution (i.e., with higher precision). The converter 101 can convert the voltage level of an analog signal into digital data with higher precision as the number N of the coding circuits 103 is increased.

However, the latch circuits 109 of all stages latch numeral data in response to the same system clock CKS. Therefore, it takes one sampling period Ts in each stage to calculate the sum of the numeral data. FIG. 3 is a timing chart of adding calculations performed in the adding circuit 110 in case of N=4 and P=2. As shown in FIG. 3, in the adding circuit 110, it takes P sampling periods P×Ts to obtain the A/D converted data DT from the N digital data DT1 to DT$_N$. Therefore, when the number N of the coding circuits 103 is increased to heighten the precision of the calculation performed in the converter 101, the period of time required for the calculation in the adding circuit 110 is increased. That is, the period of time required to obtain the A/D converted data DT is undesirably increased.

To precisely perform a servo control in a vehicle at high speed, application programs requiring the feed-back of A/D converted data at high speed are used. However, because a conventional A/D converter needs a long time to obtain A/D converted data from an analog signal, the conventional A/D converter cannot be used to execute the application programs. Therefore, an A/D converter calculating digital data at high speed with high precision is required.

SUMMARY OF THE INVENTION

An object of the present invention is to provide, with due consideration to the drawbacks of the conventional, a TDA type analog-to-digital converter which converts the voltage level of an analog signal into digital data at high speed with high precision.

According to a first aspect of this invention, the object is achieved by the provision of an analog-to-digital converter comprising a pulse delay circuit having M (M is an integer equal to or higher than two) delay units, a data holding unit, and a converted data producing unit. The pulse delay circuit transmits a pulse signal through the delay units serially arranged and delays the pulse signal in each delay unit by a delay time depending on a level of an analog signal. The data holding unit latches the pulse signal delayed in each delay unit at N (N is an integer equal to or higher than two) sampling times to hold each of M×N values at M×N sampling points of the pulse signal as a piece of latched data. The converted data producing unit receives the M×N pieces of latched data from the data holding unit as a single piece of combined data composed of the latched data arranged in an order corresponding to an arranging order of the M×N sampling points in the pulse signal, converts the combined data into numeral data, corresponding to a position of the pulse signal in the pulse delay circuit, at one time as converted digital data corresponding to the level of the analog signal.

With this structure of the converter, the M×N pieces of latched data are obtained from the pulse signal delayed in each of M actual delay units as if the M×N pieces of data were latched from M×N outputs of M×N assumed delay units set at the delay time which equals 1/N of a delay time of the actual delay units. Accordingly, although the pulse signal is actually delayed in each of the M delay units, the pulse position of the pulse signal can be specified in higher resolution. That is, the converter can convert the value of the analog signal into digital data with high precision.

Further, although a conventional converter separately processes the M×N pieces of latched data as N pieces of M-bit length data to calculate the sum of the N pieces of M-bit length data in P ($N=2^P$) steps corresponding to P stages. In contrast, the converter according to the present invention treats the M×N pieces of latched data in a lump as a single M×N-bit length combined data composed of the M×N pieces of latched data, arranged in an order corresponding to an arranging order of the M×N sampling points in the pulse signal, and converts the combined data into numerical data, indicating a pulse position of the pulse signal PA, at one time. In this conversion, the converter does not need any adding circuit disposed in the conventional converter, so that no latching operation for holding data by a predetermined period of time is performed. Therefore, the converted digital data can be immediately calculated from the combined data. Accordingly, the period of time required to convert an analog input value into digital data can be considerably shortened. As a result, the converter can be used to execute application programs requiring the feed-back of digital data at high speed, so that a servo control in a vehicle can be performed at high speed.

Moreover, the resolution or precision in the converted digital data is directly determined by the delay time in the delay units. That is, as the delay time is shortened, the resolution is heightened. Further, in the future, because gate circuits will be further miniatured in the CMOS process, the delay time in the delay unit DT formed of gate circuits will be shortened. Accordingly, the resolution in the converted digital data can be heightened in the future, so that the converter can convert the voltage level of an analog signal into digital data with higher precision.

The converted data producing unit preferably has a pulse selector and encoder that converts the combined data into the numeral data every sampling period, a latch circuit that latches the numeral data of the pulse selector and encoder every sampling period and outputs the numeral data latched just before one sampling period, and a data calculating circuit that produces the converted digital data from the numerical data held in the latch circuit and the numerical data outputted from the pulse selector and encoder.

With this structure of the converted data producing unit, the numerical data is normalized to the converted digital data. That is, in this normalization, the converted digital data corresponding to a movement of the pulse signal is determined from a change in the position of the pulse signal in one sampling period, so that the converted digital data corresponding to the level of the analog signal is specified. Although the conventional converter needs many normalizing units for normalizing N pieces of numeral data derived from N pieces of M-bit length data, the converter according to the present invention needs only one normalizing unit for normalizing the numerical data derived from the combined data to the converted digital data. Accordingly, although the number of data obtained according to the present invention is the same as that in the conventional converter, the converter according to the present invention can be manufactured in a small size.

According to a second aspect of this invention, the object is achieved by the provision of an analog-to-digital converter comprising L (L is an integer equal to or higher than two) core units and an adder circuit. Each core unit comprises the pulse delay circuit, the data holding unit and the converted data producing unit, in the same manner as the A/D converter according to the first aspect. The adder circuit calculates a sum of the pieces of converted digital data obtained in the core units as final converted digital data corresponding to the level of the analog signal.

With this structure of the converter, the converter has the core units having the same structure, so that the structure of the converter can be simplified. Further, the number of bits in the final converted digital data is larger than the converted digital data produced in each core unit. Accordingly, the pulse position of the pulse signal can be specified in higher resolution, as compared with the pulse position specified by the converted digital data of each core unit. That is, the converter can convert the value of the analog signal into digital data with higher precision.

According to a third aspect of this invention, the object is achieved by the provision of an analog-to-digital converter comprising a pulse delay circuit having M (M is an integer equal to or higher than two) delay units, N (N is an integer equal to or higher than two) coding circuits, and an adding circuit. The pulse delay circuit transmits a pulse signal through the delay units serially arranged and delays the pulse signal in each delay unit by a delay time depending on a level of an analog signal. Each coding circuit latches M outputs of the delay units at one of N sampling times every sampling period to hold M values at M sampling points of the M outputs as M pieces of latched data, calculates numeral data corresponding to a position of the pulse signal in the pulse delay circuit from a single piece of combined data, which is composed of the M latched data arranged in an order corresponding to an arranging order of the M sampling points in the pulse signal, at one time as converted digital data corresponding to the level of the analog signal every sampling period. The adding circuit calculates a sum of the pieces of converted digital data produced in the coding circuits as final converted digital data, corresponding to the level of the analog signal, every sampling period. The adding circuit comprises a plurality of adder units arranged in a binary tree structure of P ($N=2^P$) stages such that $2^{P-k}$ (k is an integer ranging from 1 to P) adder units among the adder units are arranged in parallel to one another on the k-stage, and an adder clock generating circuit. Each of the adder units arranged on the k-stage has an adder that calculates a sum of two pieces of converted digital data received from two adder units of the (k−1)-stage, and a latch circuit that latches the sum calculated in the adder and outputs the latched sum to one adder of the (k−1)-th stage as converted digital data. The adder clock generating circuit generates P adder clocks specifying P latching times at predetermined delay time intervals every sampling period, such that each delay time interval is shorter than the sampling period, and supplies the adder clocks to the latch circuits such that the latch circuits of each stage perform latching operations in synchronization with one of the adder clocks and such that the latching time in the k-th stage is later than the latching time in the (k−1)-th stage by one delay time interval.

With this structure of the converter, the adder clock generating circuit generates P adder clocks such that the P adder clocks specify P latching times at predetermined delay time intervals $\Delta T_{UD}$ shorter than the sampling period Ts, and the adder units of each stage perform the latching operations in synchronization with the corresponding adder clock. Therefore, when one delay time interval $\Delta T_{UD}$ shorter than the sampling period Ts passes after the latching operations in the adder units of the (k−1)-stage, the adder units of the k-stage perform the latching operations. That is, in the adding circuit, when the pieces of converted digital data is received, the final converted digital data can be produced from the converted digital data in a period of time $P \times \Delta T_{UD}$ equal to P times of the delay time interval $\Delta T_{UD}$.

In contrast, in a conventional converter, when one sampling period passes after the latching operations in the adder units of the (k−1)-stage, the adder units of the k-stage perform the latching operations. That is, the sum of the pieces of converted digital data is produced from the converted digital data in a period of time P×Ts equal to P times of the sampling period Ts.

Accordingly, the period of time required for the calculations of the adding circuit can be considerably shortened.

Further, each coding circuit calculates the numeral data from combined data, composed of the M latched data arranged in an order corresponding to an arranging order of the M sampling points in the pulse signal, at one time. Therefore, the numeral data can be immediately produced from the M latched data. Accordingly, the period of time required to convert an analog input value into digital data can be considerably shortened. As a result, the converter can be used to execute application programs requiring the feed-back of digital data at high speed, so that a servo control in a vehicle can be performed at high speed.

Moreover, the converter produces the final converted digital data from M×N pieces of latched data. Therefore, the converter can convert the value of the analog signal into digital data with high precision.

DETAILED DESCRIPTION OF THE PREFERRED EMBODIMENTS

Figure 1:
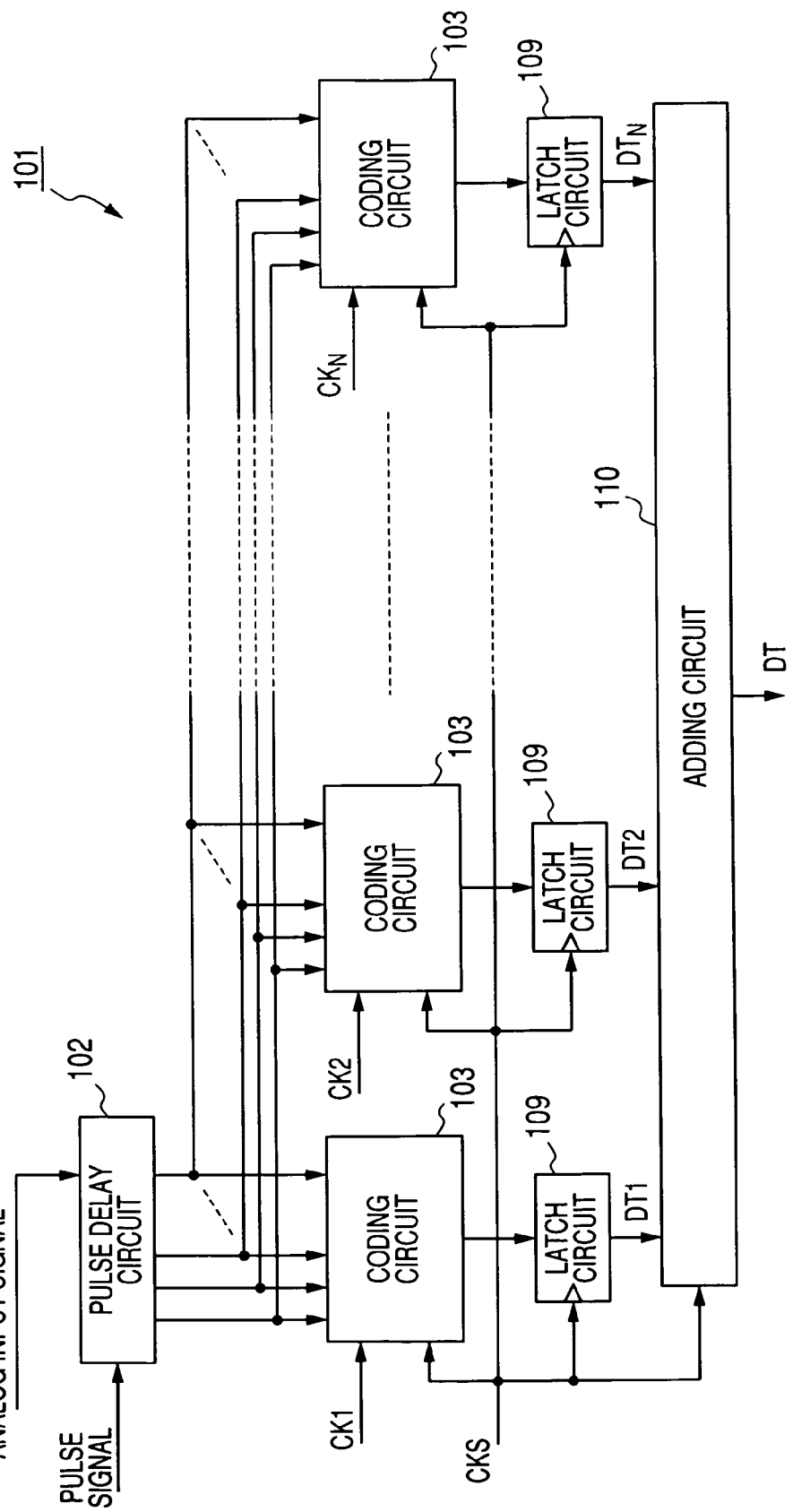
FIG. 1 is a schematic block diagram of an A/D converter in the prior art.

Embodiments of the present invention will now be described with reference to the accompanying drawings, in which like reference numerals indicate like parts, members or elements throughout the specification unless otherwise indicated.

Embodiment 1

Figure 4:
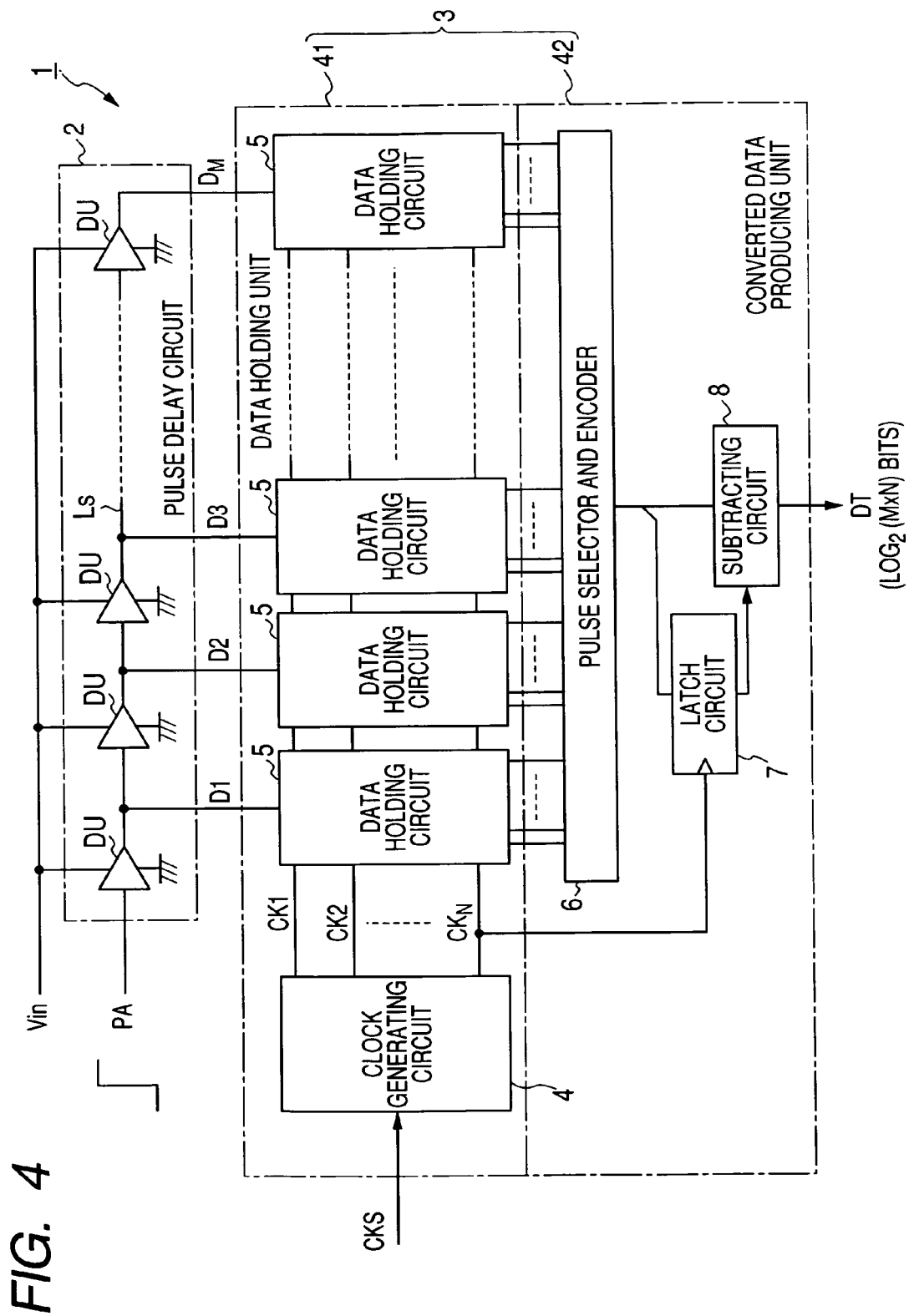
FIG. 4 is a block diagram of a TAD type A/D converter according to the first embodiment of the present invention.

FIG. 4 is a block diagram of an A/D converter according to the first embodiment. As shown in FIG. 4, a TDA type analog-to-digital (A/D) converter 1 has a pulse delay circuit 2 and a coding circuit 3. The delay circuit 2 has a plurality of delay units DU arranged in M stages (M is an integer equal to or higher than 2). Preferably, the value M equals the s-th power of 2 ($M=2^s$; s is an integer). Each delay unit DU is formed of a series of gate circuits such as even-numbered inverters. The delay units DU simultaneously receive an analog input signal (i.e., voltage signal) Vin as a driving voltage and have the same delay time Td corresponding to a voltage level of the signal Vin. As the level of the signal Vin is heightened, the delay time Td is shortened. A pulse signal PA passes through a signal transmission line Ls on which the delay units DU are serially arranged, so that the pulse PA is delayed in each of the delay units DU serially arranged. Outputs $D_1$ to $D_M$ of the delay units DU are sent to the coding circuit 3. The output $D_i$ (i=1, 2, - - -, M) of the delay unit DU of the i-stage denotes the pulse signal delayed in the delay units DU of the first to i-th stages, and each output $D_i$ is delayed from the output $D_{i-1}$ by the delay time Td.

The coding circuit 3 produces A/D converted data (i.e., converted digital data) DT indicating a quantity of movement of the pulse signal PA transmitted through the delay units DU from the outputs $D_i$ of the delay units DU. The movement of the pulse signal depends on the delay time Td. Therefore, the converter 1 substantially converts the level of the signal Vin into A/D converted data DT corresponding to the level of the signal Vin.

The coding circuit 3 has a data holding unit 41 and a converted data producing unit 42. The holding unit 41 has a clock generating circuit 4 and M data holding circuits 5 corresponding to the respective delay units DU. The clock generating circuit 4 generates N (N is an integer equal to or higher than 2) sampling clocks CK1, CK2, - - -, $CK_N$ from a reference clock CKS indicating a sampling period Ts to specify N sampling times every sampling period Ts. The sampling period Ts is set to be longer than the delay time Td. The N sampling times are different from one another at intervals of a unit time $\Delta T=Td/N$ equal to one-Nth of the delay time Td. The i-th holding circuit 5 latches the output $D_i$ of the corresponding delay unit DU in synchronization with each of the sampling clocks $CK_j$ (j=1, 2, - - -, N) to hold N pieces of latched data every sampling period Ts. The N latched data are indicated by N binary digits corresponding to N values at N sampling points of the output $D_i$ latched at N sampling times of the N sampling clocks $CK_j$, respectively.

The producing unit 42 has a pulse selector and encoder 6, a latch circuit 7 and a subtracting circuit 8. The encoder 6 receives the M×N pieces of latched data corresponding to the M×N sampling points from the holding circuits 5 as a single piece of combined data Q every sampling period Ts such that the M×N latched data of the combined data Q are arranged in an order corresponding to an arranging order of the M×N sampling points in the pulse signal PA. The encoder 6 converts the combined data Q into numerical data indicating a position (i.e., leading edge) of the pulse of the pulse signal PA in the pulse delay circuit 2. The latch circuit 7 latches the numeral data of the encoder 6 in synchronization with the sampling clock $CK_N$ of the circuit 4 every sampling period Ts and outputs another numeral data latched just before the sampling period Ts. The subtracting circuit 8 subtracts the numeral data of the latch circuit 7 from the numeral data of the encoder 6 every sampling period Ts to obtain A/D converted data DT indicating a movement of the pulse of the pulse signal PA in one sampling period Ts. The movement depends on the delay time Td, so that the A/D converted data corresponds to the voltage level of the analog input signal Vin.

Hereinafter, the structure and operation of the coding circuit 3 will be described in detail.

Figure 5:
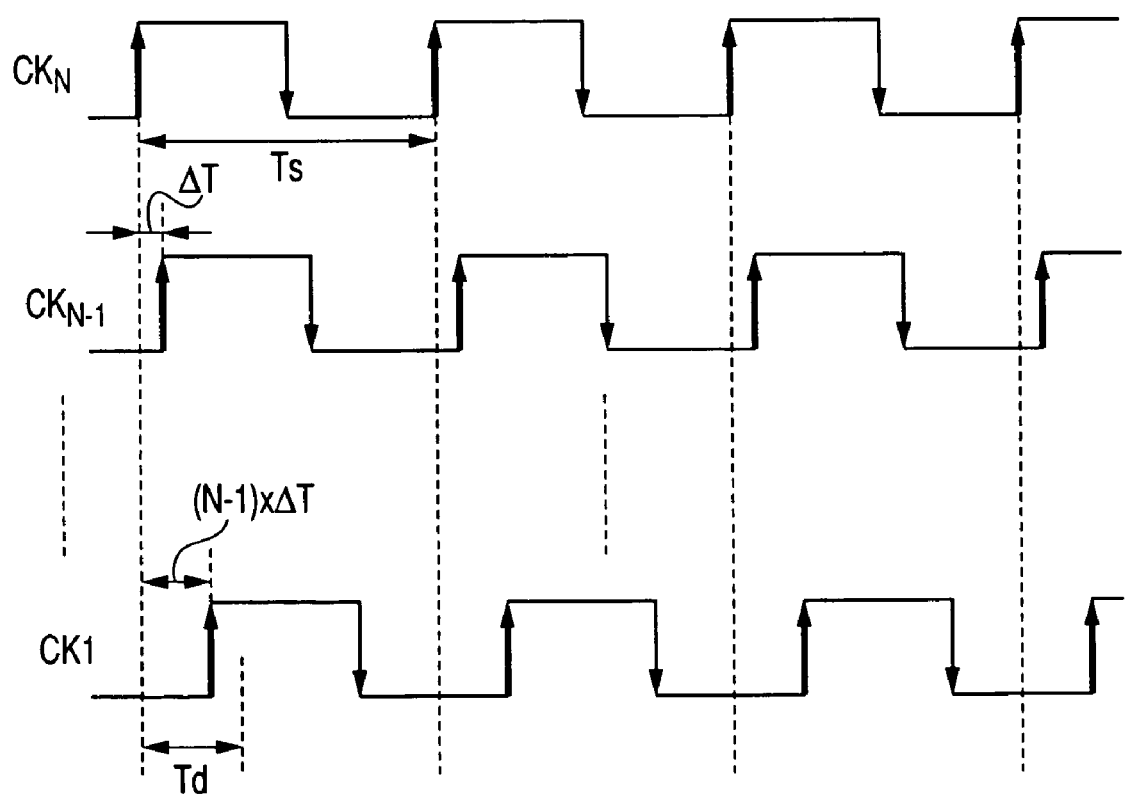
FIG. 5 is a timing chart of sampling clocks generated in a clock generating circuit of the converter shown in FIG. 4.

FIG. 5 is a timing chart of the sampling clocks CK1 to $CK_N$ generated in the circuit 4. As shown in FIG. 5, each sampling clock $CK_j$ has a pulse every sampling period Ts. The phase of each sampling clock $CK_{j-1}$ is delayed by the unit time $\Delta T=Td/N$ from that of the sampling clock $CK_j$.

Because the unit time $\Delta T$ in the sampling clocks $CK_j$ depends on the delay time Td of the delay units DU, the circuit 4 may be formed of the same type of digital elements as that of the delay unit DU such that the circuit 4 receives the analog input signal Vin to determine the delay time Td corresponding to the voltage level of the signal Vin. For example, when each delay unit DU is formed of a series of N gate circuits so as to have a delay time Td/N in each gate circuit, a delay portion of the circuit 4 is formed of the same type of gate circuits as those of the delay unit DU. In this case, the reference clock CKS is delayed in N−1 gate circuits arranged in series, the clock CKS is used as the sampling clock $CK_N$, and the sampling clocks CK1 to $CK_{N-1}$ are outputted from the N−1 gate circuits. Further, when each delay unit DU is formed of a single inverter having a delay time Td, a delay portion of the circuit 4 is, for example, formed of N inverters having different threshold values. In this case, the inverters are arranged in parallel to one another so as to receive an input signal of which the level is gradually changed, so that the inverters output the N sampling clocks $CK_j$ when the level of the input signal reaches the respective threshold values. This technique is disclosed in Published Japanese Patent First Publication No. 2004-357030.

The i-th holding circuit 5 latches the output $D_i$ of the corresponding delay unit DU in synchronization with each of the sampling clocks $CK_j$ every sampling period Ts to hold N values of N sampling points of the output $D_i$ at N sampling times indicated by the respective sampling clocks CK1 to $CK_N$ as N pieces of latched data $Q_{i,1}$ to $Q_{i,N}$ derived from the output $D_i$. When the value of the sampling point is high, the circuit 5 holds the binary digit of "1" as the latched data. When the value of the sampling point is low, the circuit 5 holds the binary digit of "0" as the latched data. Further, each holding circuit 5 outputs N pieces of latched data $Q_{i,1}$ to $Q_{i,N}$ every sampling period Ts. Therefore, the i-th holding circuit 5 holds and outputs N-bit length data composed of N pieces of data $Q_{i,1}$ to $Q_{i,N}$ every sampling period Ts.

Figure 6:
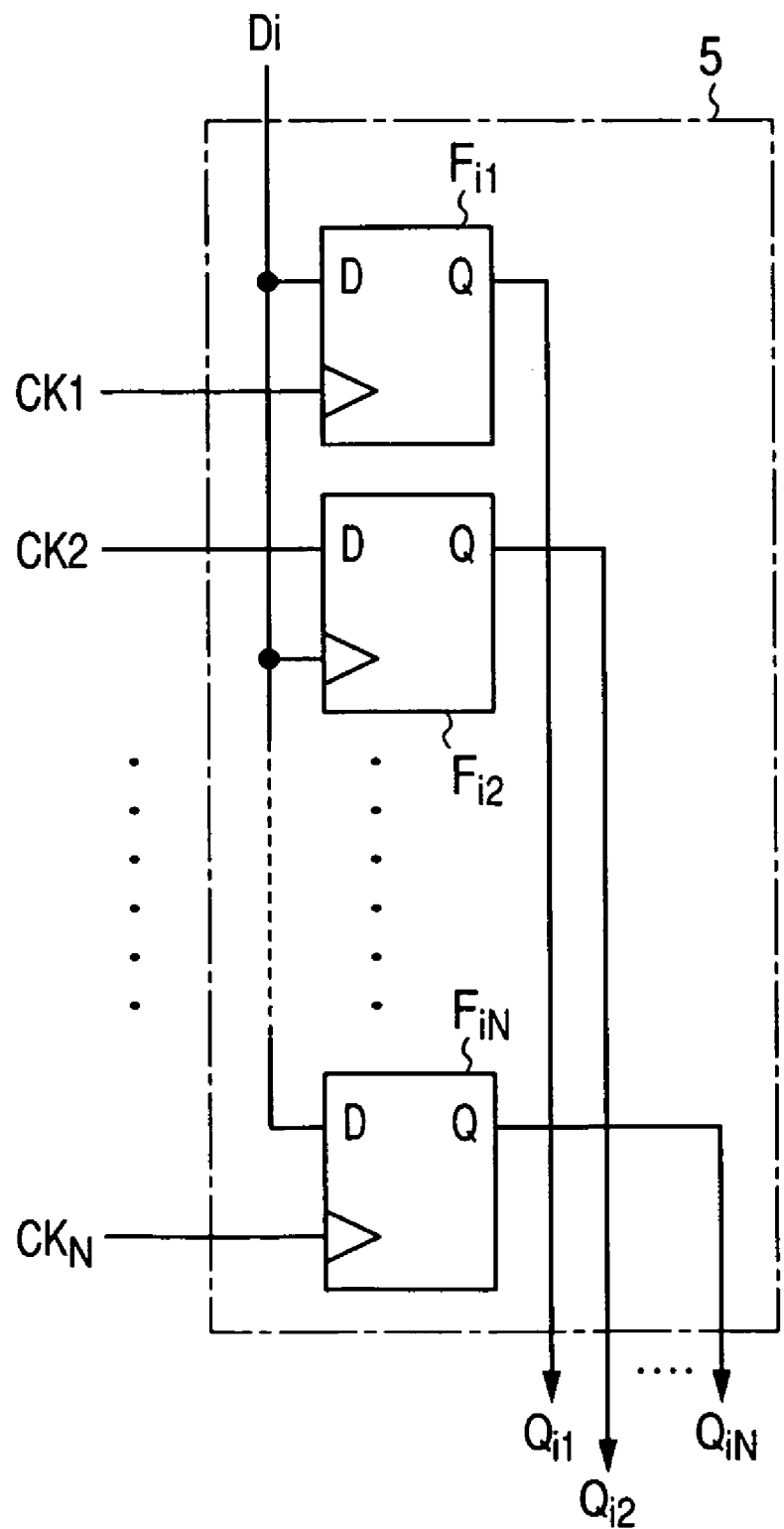
FIG. 6 is a view showing the structure of a data holding circuit of the converter shown in FIG. 4.

FIG. 6 is a view showing the structure of each holding circuit 5. As shown in FIG. 6, the i-th holding circuit 5 has N flip-flop circuits (i.e., latch circuits) Fi1 to $Fi_N$ arranged in parallel to one another. Each flip-flop circuit Fij latches the output $D_i$ in synchronization with the sampling clock $CK_j$ to hold a value of the output $D_i$ as latched data $Q_{i,j}$, and outputs the data $Q_{i,j}$.

Figure 7:
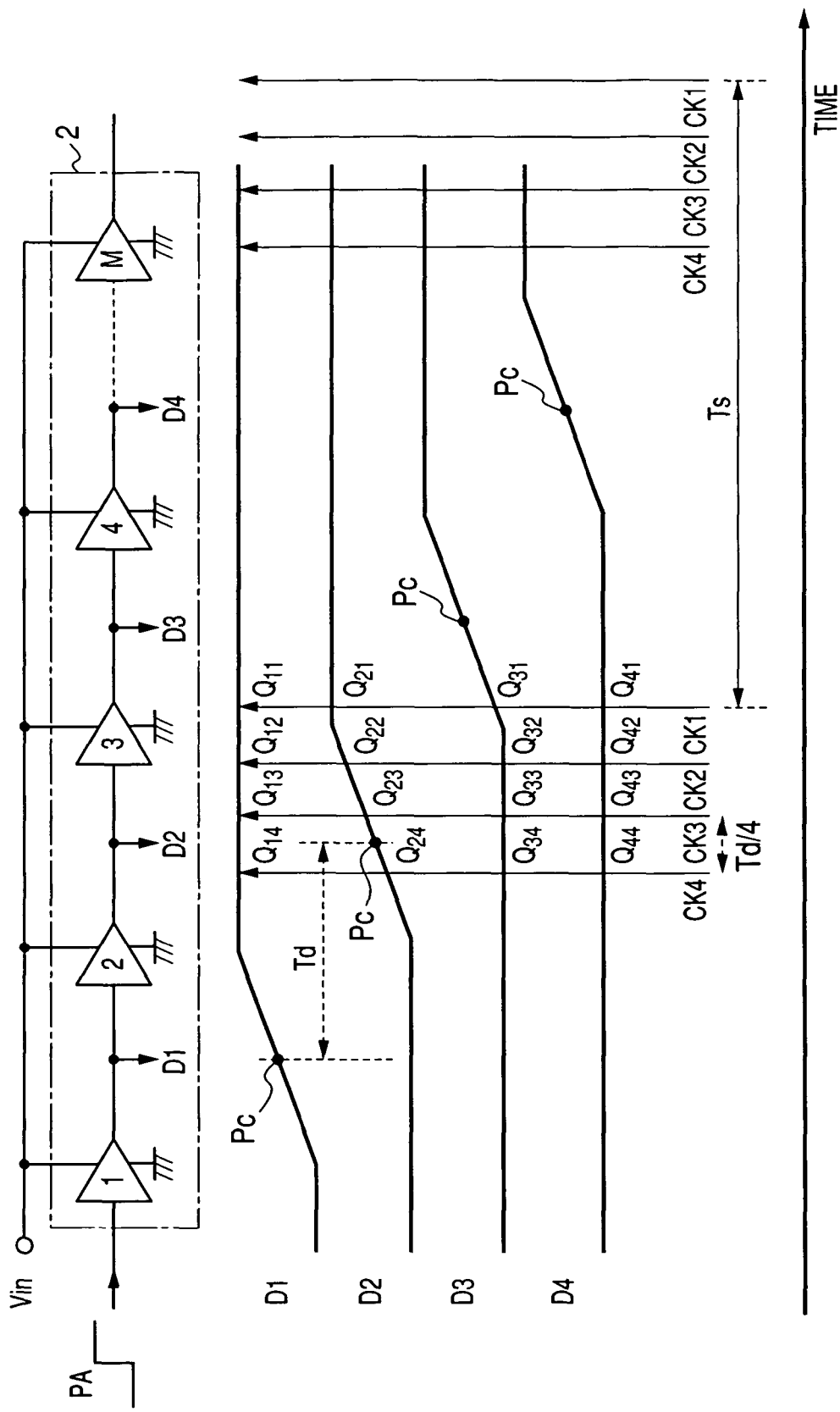
FIG. 7 is an explanatory view showing latch timing of pulse signals outputted from a pulse delay circuit of the converter shown in FIG. 4.

FIG. 7 is an explanatory view showing latch timing of the outputs $D_i$ in the holding circuits 5. In FIG. 7, the number N is set at four for convenience of explanation.

As shown in the lower half of FIG. 7, in the actual operation of the delay units DU, the level of the output $D_i$ of the delay unit DU is not momentarily changed, so that a point set at an average of the high and low levels of the output $D_i$ is defined as a level-change judging point Pc. When receiving a signal level equal to or higher than the level of the point Pc, each holding circuit 5 judges the signal level to be high. When receiving a signal level lower than the level of the point Pc, each holding circuit 5 judges the signal level to be low. Each output $D_i$ is latched in synchronization with the sampling clocks CK4, CK3, CK2 and CK1 in that order. Therefore, the latch time of the outputs $D_i$ synchronized with the sampling clock CK4 is earliest among those synchronized with the sampling clocks CK1 to CK4, and the latch time of the outputs $D_i$ synchronized with the sampling clock CK1 is latest.

In the example shown in FIG. 7, when the output D1 is latched in synchronization with the sampling clocks CK1 to CK4, the pulse of the signal PA has already passed. In this case, the first holding circuit 5 holds the latched data $Q_{1,1}$ to $Q_{1,4}$ set at the passing level (i.e., high level of "1") together. As to the output D2, the second holding circuit 5 holds the latched data $Q_{2,1}$, $Q_{2,2}$ and $Q_{2,3}$ set at the passing level together and holds the latched data $Q_{2,4}$ set at the non-passing level (i.e., low level of "0") indicating that the output D2 has not yet passed. As to the outputs D3 and D4, the third and fourth holding circuits 5 hold the latched data $Q_{3,1}$ to $Q_{3,4}$ and $Q_{4,1}$ to $Q_{4,4}$ set at the non-passing level together.

The data holding unit 41 outputs the 4×4 pieces of latched data $Q_{1,1}$, $Q_{1,2}$, $Q_{1,3}$, $Q_{1,4}$, $Q_{2,1}$, $Q_{2,2}$, $Q_{2,3}$, $Q_{2,4}$, $Q_{3,1}$, $Q_{3,2}$, $Q_{3,3}$, $Q_{3,4}$, $Q_{4,1}$, $Q_{4,2}$, $Q_{4,3}$, $Q_{4,4}$ arranged in a particular order, and the encoder 6 receives the latched data arranged in the particular order as a piece of combined data Q. The arranging order of the latched data in the combined data Q coincides with the particular order of the latched data outputted from the unit 41. In the general case of the numbers M and N, the data holding unit 41 outputs the M×N pieces of latched data $Q_{1,1}$, - - - , $Q_{1,N}$, $Q_{2,1}$, - - - , $Q_{M,N}$, arranged in the particular order, and the encoder 6 receives the latched data in a lump as a piece of M×N-bit length combined data Q which is composed of the M×N pieces of latched data arranged in the particular order.

The encoder 6 converts the combined data Q into numeral data at one time. The numeral data indicates a pulse position of the pulse signal PA, as described later in detail.

Figure 8:
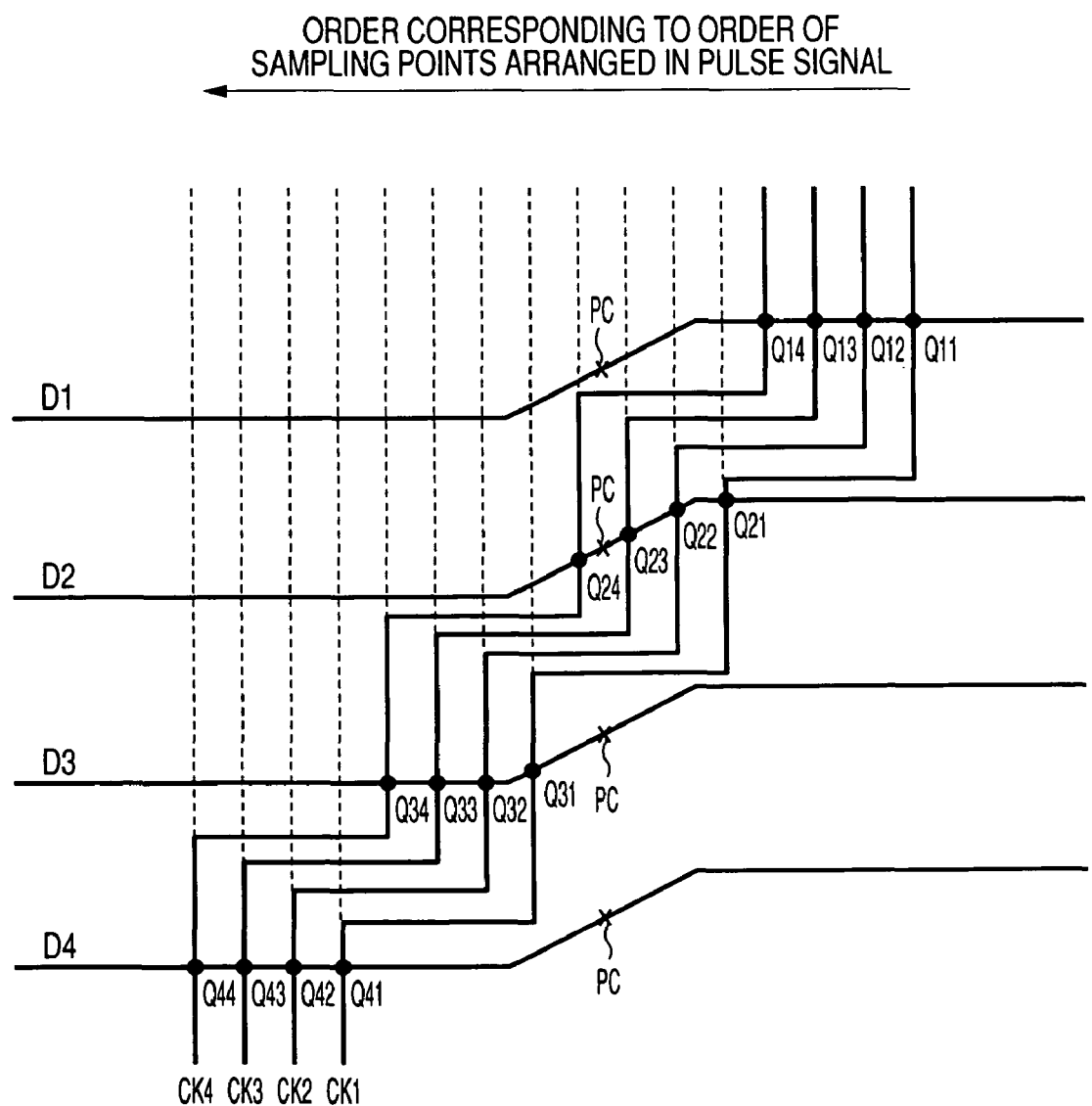
FIG. 8 is an explanatory view showing the latch timing of pulse signals when time axes for the signals are shifted so as to align level change times of the signals with one another.

The arranging order of the latched data $Q_{i,j}$ will be described in detail with reference to FIG. 7 and FIG. 8. FIG. 8 is an explanatory view showing latch timing of the outputs $D_i$ in the holding circuits 5 when time axes for the outputs $D_i$ are shifted so as to align level change times of the outputs $D_i$ with one another.

As shown in FIG. 7, a level change time of the output $D_{i+1}$ is later than that of the output $D_i$ by the delay time Td, and the delay time Td is longer by the unit time $\Delta T = Td/N$ than a period of time Td×(N−1)/N from the earliest latch time of the sampling clock $CK_N$ to the latest latch time of the sampling clock CK1. The M×N sampling points of the different outputs $D_i$ are substantially disposed on the pulse signal PA transmitted through the signal transmission line Ls.

As shown in FIG. 8, when the sampling point corresponding to the latched data $Q_{i+1,1}$ is the high level, the sampling point corresponding to the latched data $Q_{i,4}$ (representing data $Q_{i,N}$) is necessarily the high level. In contrast, when the sampling point corresponding to the data $Q_{i,4}$ is the low level, the sampling point corresponding to the data $Q_{i+1,1}$ is necessarily the low level. Therefore, in the general case of the numbers M and N, the encoder 6 receives the M×N pieces of latched data $Q_{i,j}$ of the unit 41 as the combined data Q such that the M×N pieces of latched data $Q_{i,j}$ corresponding to the M×N sampling points are arranged in the combined data Q in an order corresponding to an arranging order of the M×N sampling points in the same pulse signal PA transmitted through the signal transmission line Ls. In this embodiment, the latched data $Q_{i,j}$ are arranged so as to place the data $Q_{1,1}$ at the top bit position of the combined data Q. That is, the M×N pieces of latched data $Q_{i,j}$ are arranged in the combined data Q in an order in which the latched data detect a level change of the pulse signal PA transmitted through the signal transmission line Ls.

When the M×N sampling points are placed so as to cross the point Pc of the pulse signal PA, the combined data Q is composed of a group of upper binary digit(s) "1" and a group of lower binary digit(s) "0" partitioned by a bit boundary.

Figure 9:
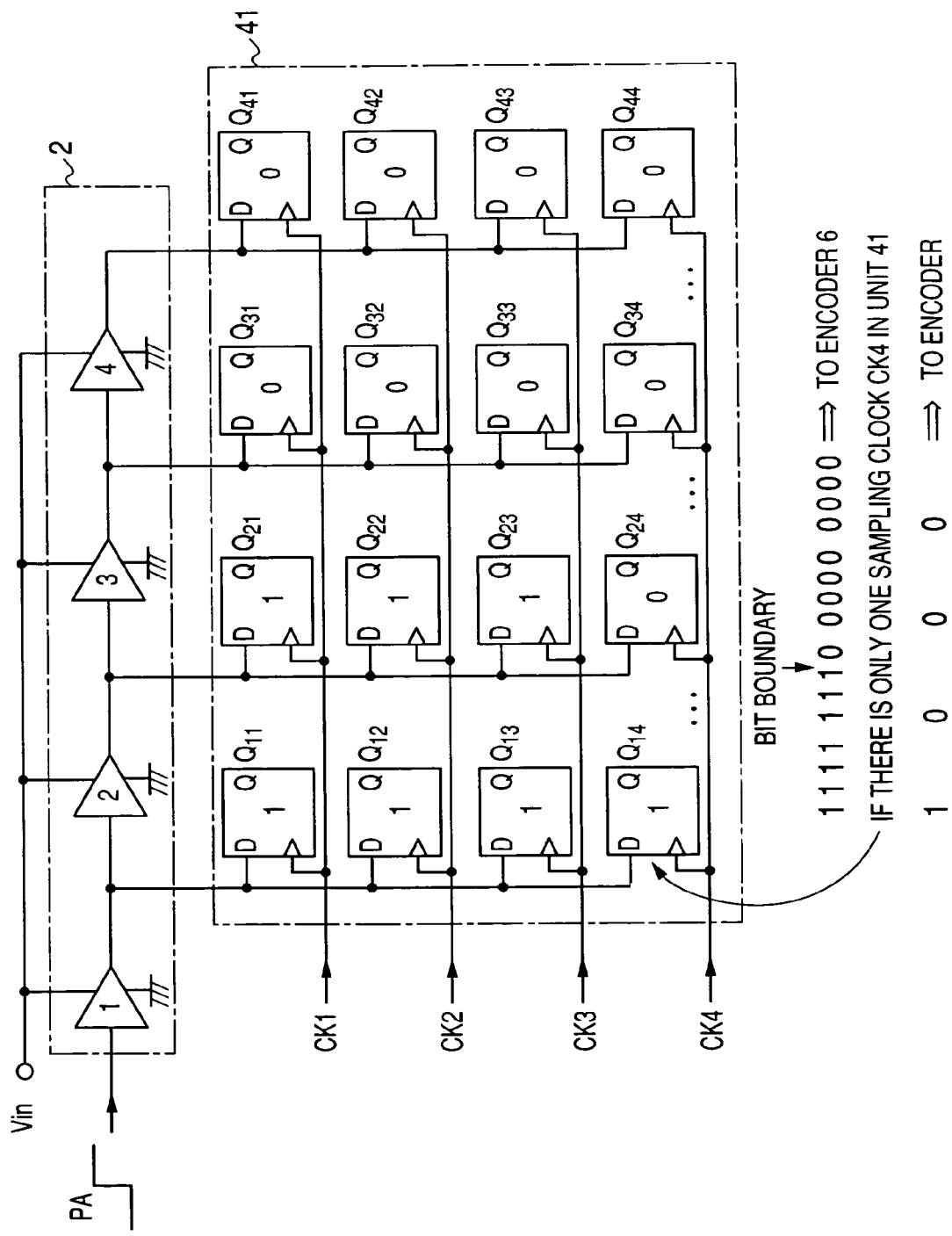
FIG. 9 shows an example of binary digits held in flip-flop circuits of the holding circuits shown in FIG. 6.

An example of the combined data Q obtained based on the example shown in FIG. 7 is described below with reference to FIG. 9. FIG. 9 shows an example of latched data $Q_{i,j}$ held in the flip-flop circuits Fij of the holding circuits 5. In FIG. 9, M=4 and N=4 are set for convenience of explanation.

As shown in FIG. 9, each of the flip-flop circuits Fij of the units 41 holds one digit "1" or "0", and the encoder 6 obtains a string of bits "1111 1110 0000 0000" composed of $Q_{1,1}$, $Q_{1,2}$, - - - , $Q_{1,4}$, $Q_{2,1}$, - - - , $Q_{2,4}$, $Q_{3,1}$, - - - , $Q_{3,4}$, $Q_{4,1}$, - - - and $Q_{4,4}$ arranged in that order as one piece of combined data Q. When the binary digits in the combined data Q contains at least one digit "0" and one digit "1", the combined data Q necessarily has a bit boundary between the digits "0" and "1". In the combined data Q, the digits placed at the positions higher than the bit boundary are set at "1" together, and the digits placed at the positions lower than the bit boundary are set at "0" together. Therefore, the bit boundary of the combined data Q corresponds to the pulse position of the pulse signal PA.

Hereinafter, the M×N pieces of latched data $Q_{i,j}$ of the combined data Q are, respectively, expressed by binary digits (bits) $Q_0$, $Q_1$, $Q_2$, - - - and $Q_{MN-1}$. The first or top bit $Q_0$ placed at the top of the combined data Q denotes the latched data $Q_{1,1}$, and the last bit $Q_{MN-1}$ placed at the bottom of the combined data Q denotes the latched data $Q_{M,N}$.

Figure 10:
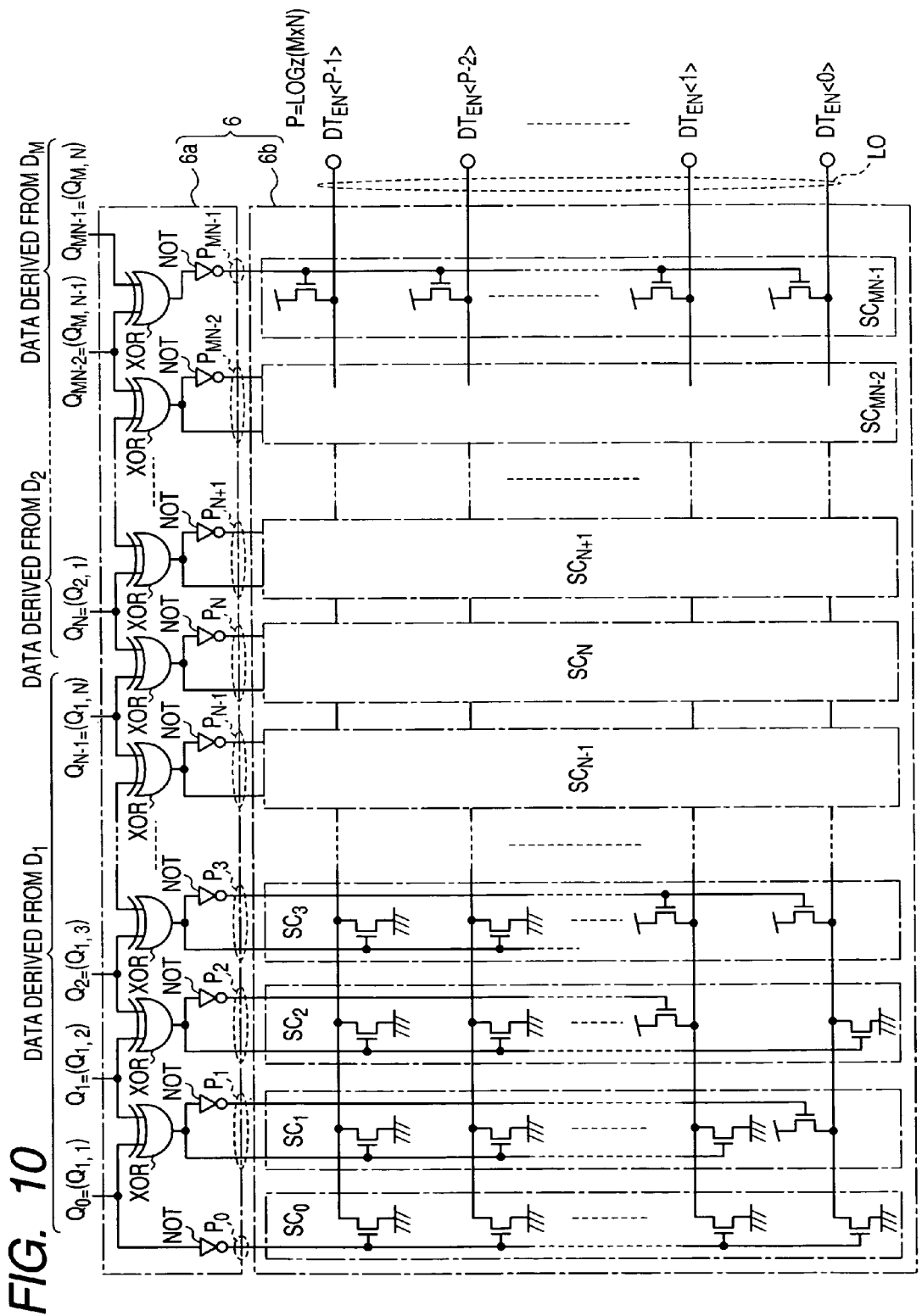
FIG. 10 is a circuit view showing the structure of an encoder of the converter shown in FIG. 4.

FIG. 10 is a circuit view showing the structure of the encoder 6.

As shown in FIG. 10, the encoder 6 has a pulse selector (i.e., boundary specifying unit) 6a which selects a position of the pulse of the pulse signal PA from positions of the signal PA by specifying a position of the bit boundary in the combined data Q, and an encoder (i.e., numeral data producing unit) 6b which encodes the selected position of the pulse to numeral data corresponding to the position of the pulse edge of the signal PA.

The pulse selector 6a has M×N−1 exclusive OR circuits XOR which simultaneously perform exclusive OR operations for M×N components of the combined data Q, a first inverter NOT which inverts the top bit $Q_0$ of the combined data Q into an inverted output as a first position output $P_k$ (k=0), and M×N−1 second inverters NOT. The k-th circuit XOR receives values of the bits $Q_{k-1}$ and $Q_k$ (k=1, 2, - - - , M×N−1) adjacent to each other in the combined data Q and outputs a result of an exclusive OR operation for the values of the bits $Q_{k-1}$ and $Q_k$ as a non-inverted output. Each second inverter NOT inverts the non-inverted output of the corresponding circuit XOR into an inverted output. The combination of the inverted output and the non-inverted output corresponding to the k-th circuit XOR is called a position output $P_k$ (k=1,2, - - - , M×N−2) , and the inverted output of the (M×N−

1)-th circuit XOR is called a position output $P_k$ (k=M×N−1). Therefore, the pulse selector 6a outputs the position outputs $P_k$ (k=0,1, - - - , M×N−1).

When the value of the top bit $Q_0$ of the combined data Q is set at the non-passing level (i.e., low level), the position output $P_0$ becomes active (i.e., high level) When the value of the top bit $Q_0$ of the combined data Q is set at the passing level (i.e., high level), the position output $P_0$ becomes non-active (i.e., low level) When values of the bits $Q_{k-1}$ and $Q_k$ adjacent to each other differ from each other, the non-inverted output of the position output $P_k$ (k=1,2, - - - , M×N−1) becomes active (i.e., high level), and the inverted output of the position output $P_k$ becomes non-active (i.e., low level) When values of the bits $Q_{k-1}$ and $Q_k$ adjacent to each other are the same as each other, the non-inverted output of the position output $P_k$ (k=1,2, - - - , M×N−1) becomes non-active (i.e., low level), and the inverted output of the position output $P_k$ becomes active (i.e., high level).

The encoder 6b has a plurality of output lines LO of which the number equals P (P=[$\log_2$(M×N)]; [X] indicates a value obtained by raising a fraction Fx of the value X, [X]=X+1−Fx when Fx>0, [X]=X when Fx=0), and M×N switching circuits $SC_k$ (k=0, 1, - - - , M×N−1), respectively, receiving the position outputs $P_k$. In this embodiment, the number P equals $\log_2$(M×N). The p-th (p=0,1, - - - , P−1) output line LO corresponds to the (p+1)-th bit position in a bit string of the numeral data and indicates a value of $2^p$ when being set at the high level.

The switching circuit $SC_0$ has P first transistors (i.e., first switching elements) connected with the P output lines LO, respectively. The switching circuit $SC_{M\times N-1}$ has P second transistors (i.e., second switching elements) connected with the P output lines LO, respectively. Each first transistor is, for example, formed of an n-channel metal-oxide-semiconductor field effect transistor (MOSFET). Each second transistor is, for example, formed of a p-channel MOSFET. When the decimal value k (k=1,2, - - - , M×N−2) expressed by a bit string in binary numeral has bit(s) of "1" at particular bit position(s) of the string, the switching circuit $SC_k$ has second transistor(s), respectively, connected with particular output line(s) LO corresponding to the particular bit position(s) and first transistor(s), respectively, connected with the other output line(s) LO. For example, the switching circuit $SC_{13}$ (the value 13 is expressed by a bit string "1101") has three second transistors connected with the zero-th output line LO indicating a value of $2^0$, the 2nd output line LO indicating a value of $2^2$ and the 3rd output line LO indicating a value of $2^3$.

The gate of each first transistor is connected with the output of the first inverter NOT or the output of one circuit XOR to receive the position output $P_0$ or the non-inverted output of the position output $P_k$ (k=1, 2, - - - , M×N−2). The source of each first transistor is earthed, and the drain of each first transistor is connected with one output line LO. When the gate of each first transistor receives a low-level signal, the transistor is closed. When the gate of each first transistor receives a high-level signal, the transistor is opened to set the corresponding output line LO at the low level. The gate of each second transistor is connected with the output of one second inverter NOT to receive the position output $P_{MN-1}$ or the inverted output of the position output $P_k$ (k=1,2, - - - , M×N−2) The source of each second transistor is connected with a high voltage terminal, and the drain of each second transistor is connected with one output line LO. When the gate of each second transistor receives a high-level signal, the transistor is closed. When the gate of each second transistor receives a low-level signal, the transistor is opened to set the corresponding output line LO at the high level.

With this structure of the encoder 6, when the pulse of the pulse signal PA has not yet passed through any delay unit DU, the top bit $Q_0$ of the combined data Q is necessarily set at the low level, and the inverted output of the first inverter NOT is set at the high level. In this case, all transistors of the switching circuit $SC_0$ are opened so as to set all output lines LO at the low level. Therefore, the encoder 6 outputs a value set at zero as numeral data corresponding to the pulse position of the signal PA.

When the pulse of the pulse signal PA has passed through at least one delay unit DU so as to place the bit boundary of the combined data Q between bits $Q_{k-1}$ and $Q_k$ set at different values, the circuits XOR other than the k-th circuit XOR output low-level signals, and the second inverters NOT corresponding to those circuits XOR output high-level signals. Therefore, the transistors of the switching circuits other than the switching circuit $SC_k$ are closed so as to set the output lines LO connected with the transistors at high impedance. In contrast, the k-th circuit XOR receiving the bits $Q_{k-1}$ and $Q_k$ outputs a high-level signal, and the second inverter NOT corresponding to this circuit XOR outputs a low-level signal. Therefore, the second transistor(s) of the switching circuit $SC_k$ are opened to set particular output line(s) LO connected with the second transistor(s) of the circuit $SC_k$ at the high level, and the first transistor(s) of the switching circuit $SC_k$ are opened to set the other output line(s) LO at the low level.

Because the particular output lines LO set at the high level indicate the decimal value k expressed by the bit string (i.e., string of bits $DT_{EN}$<P−1>, $DT_{EN}$<P−2>, - - - , $DT_{EN}$<1>, $DT_{EN}$<0>) in binary numeral, the encoder 6 outputs P-bit length numeral data indicating the decimal value k. Further, the bit boundary between the bits $Q_{k-1}$ and $Q_k$ of the combined data Q indicates that the pulse of the pulse signal PA is placed between two adjacent sampling points of the pulse signal PA corresponding to the bits $Q_{k-1}$ and $Q_k$. Therefore, the encoder 6 outputs numeral data indicating the pulse position of the signal PA.

When two values of the pulse signal PA corresponding to the bits $Q_{k-1}$ and $Q_k$ set at different values are latched by the i-th holding circuit 5 in synchronization with two sampling clocks CKj−1 and CKj, it is ascertained that the pulse of the signal PA is placed between the delay units DU of the i-th and (i+1)-th stages at a time between sampling times of the sampling clocks $CK_{j-1}$ and $CK_j$. In contrast, when the i-th and (i+1)-th holding circuits 5 latch respective values of the pulse signal PA corresponding to the bits $Q_{k-1}$ and $Q_k$ in synchronization with two sampling clocks CK1 and $CK_N$, it is ascertained that the pulse of the signal PA is just delayed in the delay unit DU of the (i+1)-th stage at a time between the sampling time of the sampling clock CK1 and the sampling time of the sampling clock $CK_N$ of the next sampling period. Therefore, the pulse position of the signal PA is specified at a resolution corresponding to the unit time Td/N.

When the bottom bit $Q_{MN-1}$ of the combined data Q is set at the passing level, all bits of the combined data Q are set at the high level. That is, the pulse of the pulse signal PA has been already gone away from the delay units DU. Therefore, no holding circuits 5 detect a pulse of the pulse signal PA. In this case, all transistors are closed to set all output lines LO at high impedance, so that the encoder 6 outputs no numeral data.

The latch circuit 7 latches the numeral data of the encoder 6 in synchronization with the sampling clock $CK_N$ of the circuit 4 every sampling period Ts and outputs other numeral data latched just before the sampling period Ts, and the subtracting circuit 8 subtracts the numeral data of the latch circuit 7 from the numeral data of the encoder 6 to obtain a subtracted value as A/D converted data DT.

Because the A/D converted data DT indicates a difference between the pulse position of the pulse signal PA at the measuring time and the pulse position of the pulse signal PA at a time earlier than the measuring time by the sampling period Ts, the A/D converted data DT denotes numeral data corresponding to a quantity of movement of the pulse signal PA during one sampling period Ts. Because the delay time Td is changed with the voltage level of the analog input signal Vin, the quantity of movement of the pulse signal PA is changed with the level of the analog input signal Vin. This quantity of movement is specified at a resolution corresponding to the unit time Td/N. Therefore, the coding circuit 3 outputs the A/D converted data DT corresponding to the voltage level of the analog input signal Vin, so that the converter 1 can convert the voltage level of the analog input signal Vin into a numeral value.

As described above, in the converter 1 according to this embodiment, each of the delay units DU has the delay time Td changing with the voltage level of the analog input signal Vin, the pulse signal PA is delayed in the delay units DU of the pulse delay circuit 2 by the delay time Td one after another. The data holding unit 41 latches the outputs D1 to $D_M$ of the delay unit DU in synchronization with each of the sampling clocks $CK_1$ to $CK_N$ every sampling period Ts to hold M×N pieces of latched data $Q_{1,1}$ to $Q_{M,N}$ corresponding to M×N values at M×N sampling points of the outputs D1 to $D_M$. The sampling points of the outputs D1 to $D_M$ correspond to sampling points of the pulse signal PA. The encoder 6 receives the M×N pieces of latched data $Q_{1,1}$ to $Q_{M,N}$ in a lump as one piece of (M×N)-bit length combined data Q, arranged in an order corresponding to an arranging order of the sampling points arranged in the pulse signal PA, every sampling period Ts. The encoder 6 converts the combined data Q into numerical data, indicating a pulse position of the pulse signal PA, at one time every sampling period Ts. The subtracting circuit 8 calculates A/D converted data DT indicating a movement of the pulse of the pulse signal PA from the numeral data presently calculated and the numeral data calculated just before one sampling period Ts. The movement depends on the delay time Td, so that the A/D converted data DT corresponds to the voltage level of the analog input signal Vin.

Therefore, in this embodiment, the M×N pieces of latched data $Q_{1,1}$ to $Q_{M,N}$ corresponding to M×N values at M×N sampling points of the pulse signal PA are obtained from M outputs of M delay units DU as if the M×N pieces of data were latched from M×N outputs of M×N delay units DU having the delay time Td/N. Accordingly, although the pulse signal PA is actually delayed in each of M delay units DU having the delay time Td, the pulse position of the pulse signal PA can be specified in a resolution corresponding to the unit time ΔT=Td/N shorter than the delay time Td. That is, the converter 1 can convert the voltage level of the analog signal Vin into digital data with high precision.

Further, the conventional converter 101 shown in FIG. 1 separately processes the M×N pieces of data as N pieces of M-bit length data obtained in synchronization of the respective sampling clocks $CK_1$ to $CK_N$ to calculate the sum of the N pieces of M-bit length data in P ($N=2^P$) steps corresponding to the P stages. In contrast, the converter 1 according to this embodiment treats the M×N pieces of latched data $Q_{1,1}$ to $Q_{M,N}$, arranged in an order corresponding to an arranging order of M×N sampling points in the pulse signal PA, as a single M×N-bit length combined data Q in a lump and converts the combined data Q into numerical data, indicating a pulse position of the pulse signal PA, at one time. In this conversion, the converter 1 does not need any adding circuit such as the adding circuit 110 disposed in the conventional converter 101, so that no latching operation for holding data by a predetermined period of time is performed. Therefore, the A/D converted data DT can be immediately calculated from the combined data Q, obtained in synchronization with the sampling clocks based on one reference clock CKS, before the next reference clock CKS. Accordingly, the period of time required to convert an analog input value into digital data can be considerably shortened. As a result, the A/D converter 1 can be used to execute application programs requiring the feed-back of A/D converted data at high speed, so that a servo control in a vehicle can be performed at high speed.

Moreover, the converter 1 has a normalizing unit composed of the latch circuit 7 and the subtracting circuit 8 to normalize the numerical data. That is, although the movement of the pulse signal PA depends on the voltage level of the analog signal Vin, the quantity of this movement in the pulse signal PA is specified in this normalization. Although the conventional converter 101 needs many normalizing units (e.g., latch circuits 109), the converter 1 needs only one normalizing unit. Accordingly, although the number of data obtained every sampling period in this embodiment is the same as that in the conventional converter 101, the converter 1 can be manufactured in a small size.

Furthermore, the resolution or precision in the A/D converted data DT is directly determined by the delay time Td in the delay units DU. That is, as the delay time Td is shortened, the resolution is heightened. Further, in the future, because the gate circuit will be further minutely formed in the CMOS process, the delay time in the delay unit DT formed of gate circuits will be shortened. Accordingly, the resolution in the A/D converted data DT will be heightened, so that the converter 1 can convert the voltage level of the analog signal Vin into digital data with higher precision in the future.

Modifications

In this embodiment, each delay unit DU merely delays the pulse signal PA by the delay time Td. However, each delay unit DU may be formed of an inverter so as to invert and delay the signal PA. In this case, when the sampling points corresponding to the M×N pieces of latched data $Q_{i,j}$ of the holding circuits 5 crosses the level change point Pc of the pulse signal PA, the combined data Q has a bit boundary between bits of "0" or between bits of "1". In the other bits of the combined data Q, the digits "0" and "1" are alternately placed. Therefore, the position of the bit boundary corresponds to the pulse position of the pulse signal PA.

Figure 11:
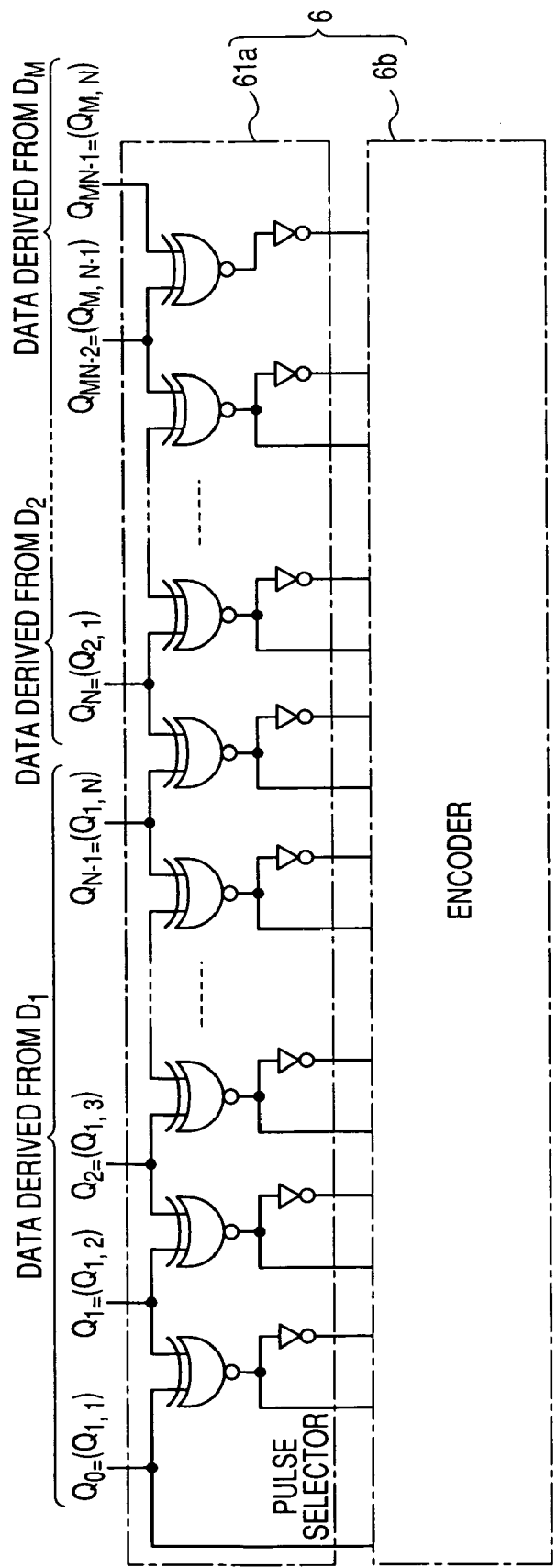
FIG. 11 is a circuit view showing the structure of an encoder of an A/D converter according to a modification of the first embodiment.

FIG. 11 is a circuit view showing the structure of an encoder of an A/D converter according to a modification of the first embodiment.

To specify this bit boundary placed between digits "0" or between digits "1", as shown in FIG. 11, the encoder 6 of the A/D converter has a pulse selector 61a and the encoder 6b. This pulse selector 61a has M×N−1 exclusive negative OR circuits XNOR and M×N−1 inverters NOT corresponding to the circuits XNOR. The k-th circuit XNOR receives values of the bits $Q_{k-1}$ and $Q_k$ (k=1, 2, - - -, M×N−1) adjacent to each other in the combined data Q and outputs a result of an exclusive NOR operation for values of the bits $Q_{k-1}$ and $Q_k$ as a non-inverted output. Each inverter NOT inverts the non-inverted output of the corresponding circuit XNOR into an inverted output. A value of the first bit $Q_0$ in the combined data Q is called a position output $P_0$. The combination of the inverted output and the non-inverted output corresponding to the k-th circuit XNOR is called a position output $P_k$ (k=1, 2, - - - , M×N−2). The inverted output of the (M×N−1)-th circuit XOR is called a position output $P_k$ (k=M×N−1). Therefore, the pulse selector 61a outputs the position outputs $P_k$ (k=0,1, - - - , M×N−1).

With this structure of the pulse selector 61a, when the pulse of the pulse signal PA has not yet passed through any delay unit DU, the top bit $Q_0$ of the combined data Q is necessarily set at the high level. In this case, all transistors of the switching circuit $SC_0$ are opened so as to set all output lines LO at the low level. Therefore, the encoder 6 outputs a value set at zero as numeral data corresponding to the pulse position of the signal PA.

When the pulse of the pulse signal PA has passed through at least one delay unit DU so as to place the bit boundary of the combined data Q between the bits $Q_{k-1}$ and $Q_k$, the circuits XNOR other than the k-th circuit XNOR output low-level signals, and the second inverters NOT corresponding to those circuits XNOR output high-level signals. Therefore, the transistors of the switching circuits other than the switching circuit $SC_k$ are closed. In contrast, the k-th circuit XNOR outputs a high-level signal, and the second inverter NOT corresponding to this circuit XOR outputs a low-level signal. Therefore, the second transistor(s) of the switching circuit $SC_k$ are opened to set particular output line(s) LO connected with the second transistor(s) of the circuit $SC_k$ at the high level, and the first transistor(s) of the switching circuit $SC_k$ are opened to set the other output line(s) LO at the low level. Therefore, the encoder 6 outputs numeral data indicating the pulse position of the signal PA.

Further, in this embodiment, as shown in FIG. 5, the sampling times specified by the sampling clocks $CK_j$ every sampling period Ts are differentiated from one another at equal intervals of the unit time Td/N. However, the sampling times specified by the sampling clocks $CK_j$ every sampling period Ts may be set at intervals different from one another on condition that a difference between the latest sampling time of the sampling clock CK1 and the earliest sampling time of the sampling clock $CK_N$ is shorter than the delay time Td. Further, the sampling times specified by the sampling clocks $CK_j$ every sampling period Ts may be set such that a difference between the latest sampling time of the sampling clock CK1 and the earliest sampling time of the sampling clock $CK_N$ is equal to or longer than the delay time Td. In this case, the N×M pieces of latched data $Q_{i,j}$ arranged in the encoder 6 in an order corresponding to an arranging order of the N×M sampling points in the pulse signal PA transmitted through the signal transmission line Ls is differentiated from the order of bits $Q_{1,1}, Q_{1,2}, $ - - - $, Q_{1,N}, Q_{2,1}, Q_{2,2}, $ - - - $, Q_{M,N}$ or the order inverted to the bit order.

Moreover, in this embodiment, the converter 1 has the latch circuit 7 and the subtracting circuit 8 to normalize the numeral data to the A/D converted data DT. However, because the numeral data indicating a pulse position of the pulse signal PA corresponds to the level of the analog input signal Vin, the converter may output the numeral data as the A/D converted data DT without using any circuit 7 or 8.

Embodiment 2

Figure 12:
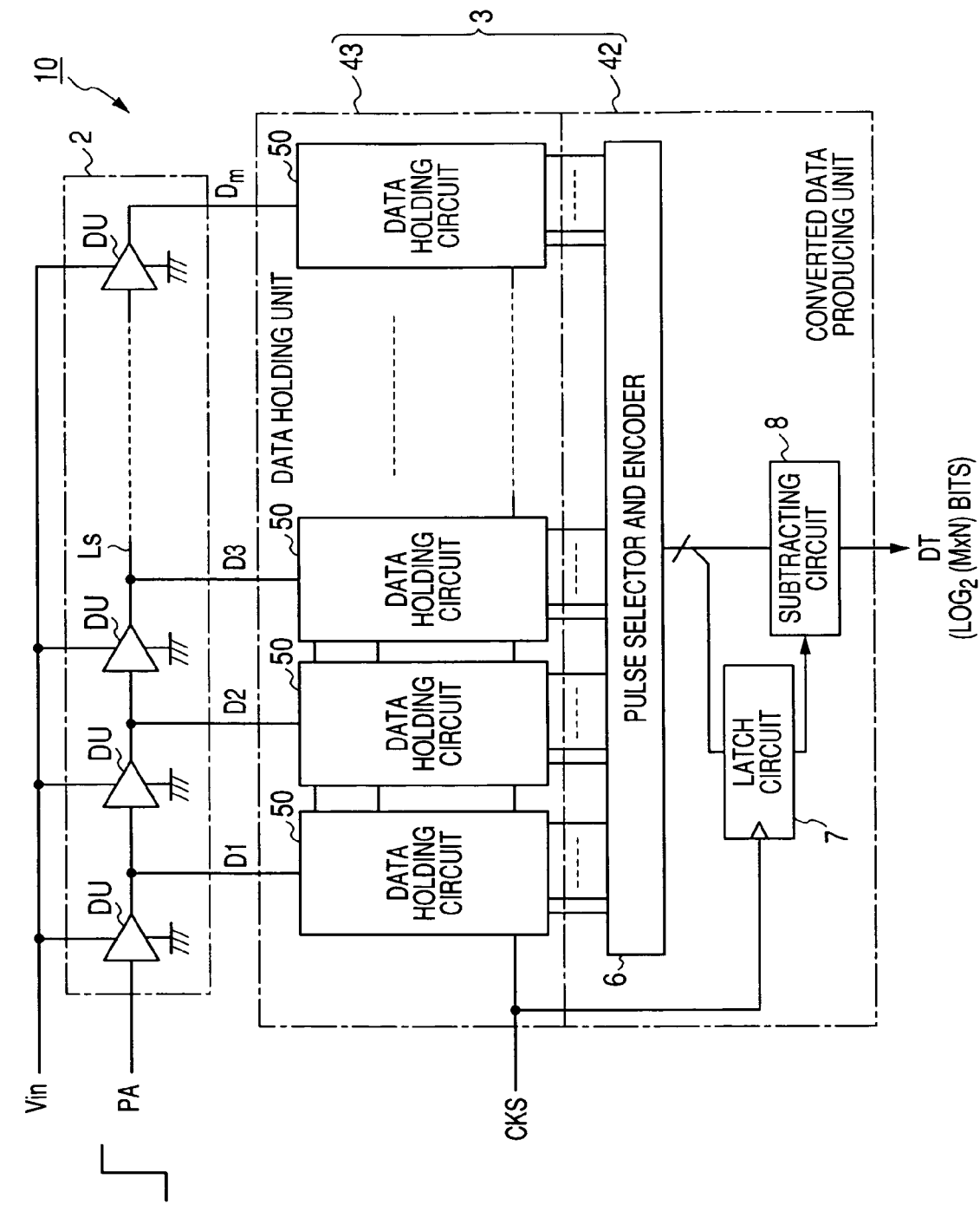
FIG. 12 is a block diagram of a TAD type A/D converter according to the second embodiment of the present invention.

FIG. 12 is a block diagram of an A/D converter according to the second embodiment.

As shown in FIG. 12, a TAD type A/D converter 10 has the pulse delay circuit 2 and a coding circuit 30 for producing A/D converted data DT indicating a quantity of movement of the pulse signal PA. The coding circuit 30 has a data holding unit 43 and the producing unit 42. The holding unit 43 has M data holding circuits 50 corresponding to the respective delay units DU to latch the outputs $D_i$ of the circuit 2 and to hold M×N pieces of latched data.

Figure 13:
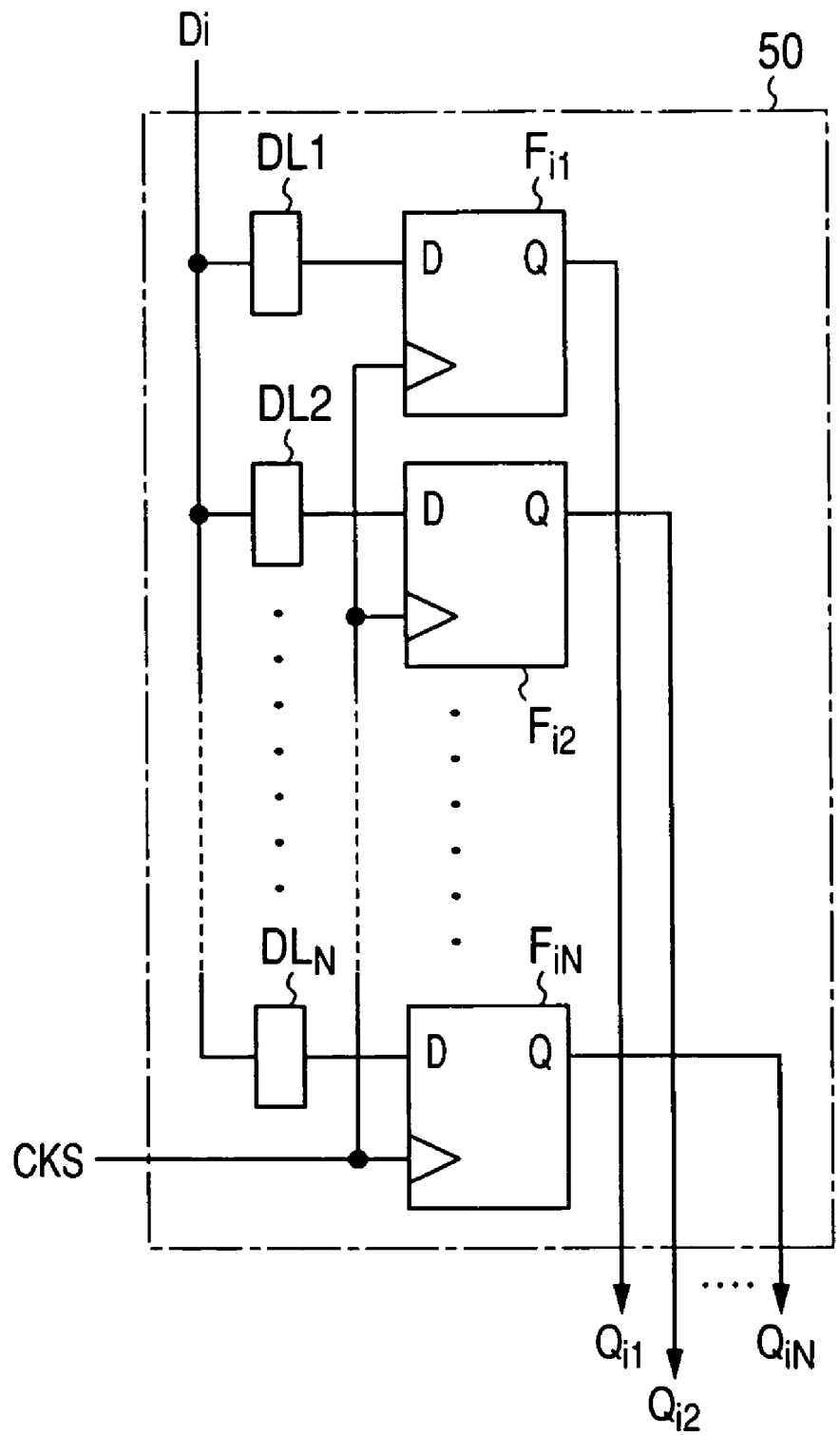
FIG. 13 is a view showing the structure of a data holding circuit of the converter shown in FIG. 12.

FIG. 13 is a view showing the structure of each holding circuit 50 of the converter 10.

As shown in FIG. 13, each holding circuit 50 has N delay elements DL1 to $DL_N$ and the N flip-flop circuits (i.e., latch circuits) Fi1 to $Fi_N$ corresponding to the respective delay elements DL1 to $DL_N$. Each delay element $DL_j$ (j=1,2, - - - , N) delays the output $D_i$ of the corresponding delay unit DU by a multiplied unit time $\Delta Tn_j$ ($\Delta Tn_j$=j×$\Delta$T) equal to j times the unit time $\Delta$T. That is, the output $D_i$ is delayed in the elements $DL_1$ to $DL_N$ to produced N delayed outputs such that the phases of the N delayed outputs are differentiated by intervals equal to those of the sampling times. Each flip-flop circuit Fij latches the output of the corresponding delay element $DL_j$ in synchronization with the reference clock CKS every sampling period Ts to hold a value of the output at a sampling time indicated by the reference clock CKS as latched data $Q_{i,j}$ and outputs the latched data $Q_{i,j}$.

The N delay elements $DL_j$ are, respectively, formed of N inverters having different threshold values. For example, each inverter receives a chopping signal of which the level is gradually increased and dropped every sampling period Ts, and the inverter receiving the output $D_i$ outputs the output $D_i$ when the level of the chopping signal reaches the respective threshold values. Therefore, the delay elements $DL_j$ can produce N delayed outputs delayed by the respective multiplied unit times $\Delta Tn_j$. This technique is disclosed in Published Japanese Patent First Publication No. 2004-357030.

In this embodiment, the holding unit 43 does not latch the outputs $D_i$ of the delay circuit 2 at N latch times indicated by the sampling clocks $CK_j$, but latch each output $D_i$ of the delay circuit 2 at N latch times by delaying N input signals derived from the output $D_i$ and received in the N flip-flop circuit Fij by N multiplied unit times. Therefore, the holding unit 43 outputs M×N pieces of latched data $Q_{i,j}$ every sampling period Ts in the same manner as the holding unit 41 without using the clock generating circuit 4.

In this embodiment, the holding circuit 50 has N delay circuits. However, the flip-flop circuit Fi1 directly may latch the output $D_i$ of the corresponding delay unit DU in synchronization with the reference clock CKS without using the delay element DL1. In this case, each delay element $DL_n$ (n=2, - - - , N) delays the output $D_i$ by a multiplied unit time $\Delta$Tn ($\Delta$Tn=(n−1)×$\Delta$T) equal to n−1 times the unit time $\Delta$T.

Accordingly, the converter 10 can convert the level of the signal Vin into A/D converted data DT indicating the level of the signal Vin with high precision and at high speed, in the same manner as the converter 1 shown in FIG. 4.

Embodiment 3

There is a case where bit error occurs in the latched data supplied from the holding circuits 5. In this case, the combined data Q composed of the latched data undesirably has a plurality of bit boundaries. Further, bit error sometimes occurs in a series of bits of the combined data Q. In this embodiment, even when bit error occurs in the latched data such that the combined data Q has a plurality of bit boundaries, the latched data are appropriately corrected to form a piece of corrected data Qc having only one bit boundary.

Figure 14:
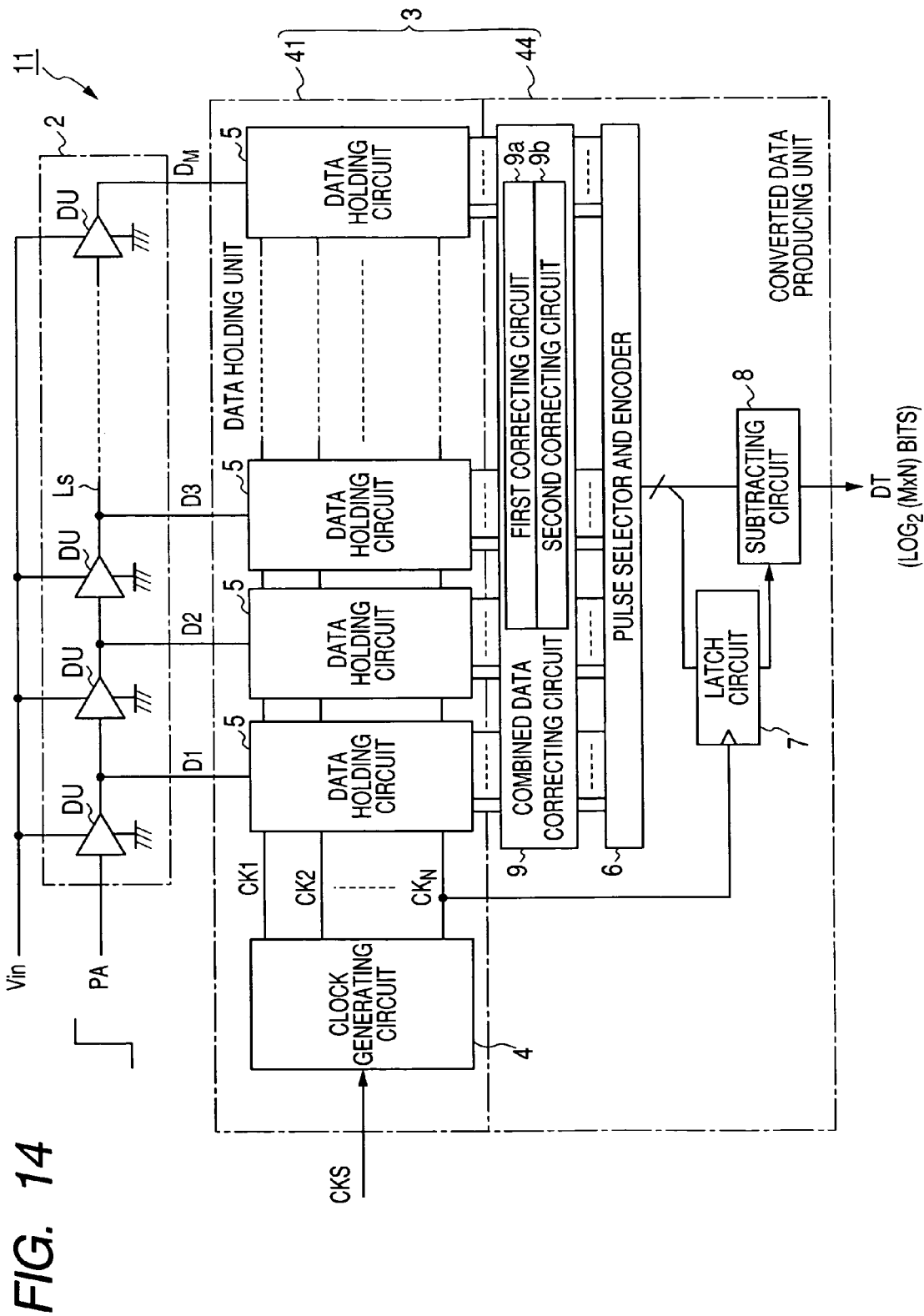
FIG. 14 is a block diagram of a TAD type A/D converter according to the third embodiment of the present invention.

FIG. 14 is a block diagram of an A/D converter according to the third embodiment.

As shown in FIG. 14, a TAD type A/D converter 11 has the pulse delay circuit 2 and a coding circuit 31 for producing A/D converted data DT indicating a quantity of movement of the pulse signal PA. The coding circuit 31 has the data holding unit 41 and a converted data producing unit 44. The producing unit 44 has a combined data correcting circuit 9 for receiving the latched data from the holding circuits 5 as the combined data Q and correcting the combined data Q to a piece of corrected data S, the encoder 6 for producing numeral data from the corrected data S, the latching circuit 7, and the subtracting circuit 8. The corrected-data S is processed in the encoder 6. The correcting circuit 9 has a first correcting circuit 9a for correcting the combined data Q to a piece of first corrected data R and a second correcting circuit 9b for correcting the first corrected data R to the corrected data S.

Figure 15A:
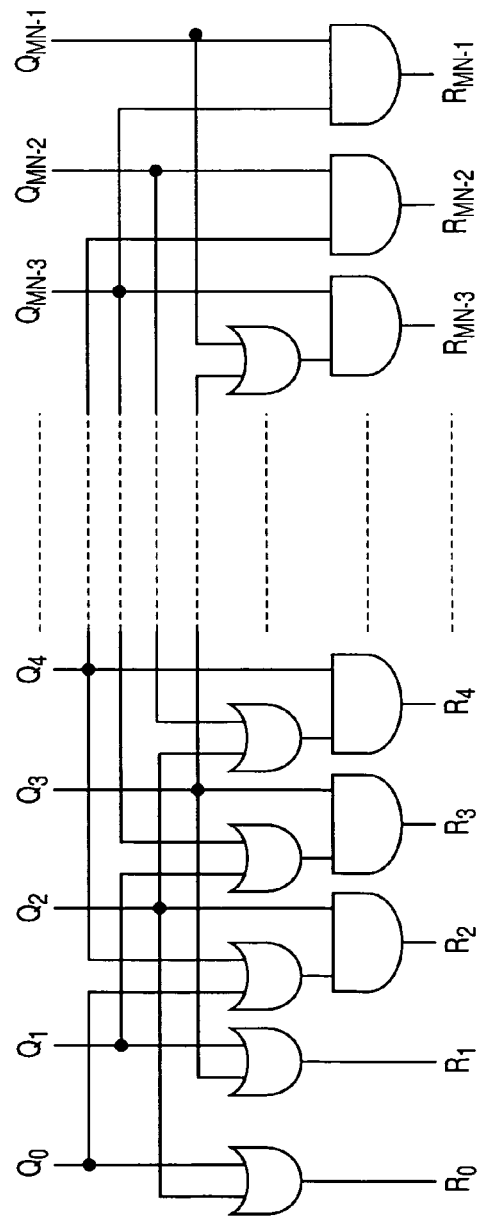
FIG. 15A is a view showing the structure of a first correcting circuit of the converter shown in FIG. 14.

FIG. 15A is a view showing the structure of the first correcting circuit 9a of the converter 11. FIG. 15B is a view of a correction unit of the circuit 9a for each of the first and second bits $Q_0$ and $Q_1$ of the combined data Q, FIG. 15C is a view of a correction unit of the circuit 9a for each of the middle bits $Q_k$ (k=2, - - -, M×N−3) of the combined data Q, and FIG. 15D is a view of a correction unit of the circuit 9a for each of the last two bits $Q_{MN-2}$ and $Q_{MN-1}$ of the combined data Q.

Figure 15D:
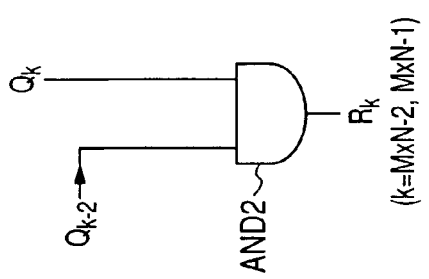
FIG. 15D is a view of another correction unit of the correcting circuit shown in FIG. 15A.
Figure 15C:
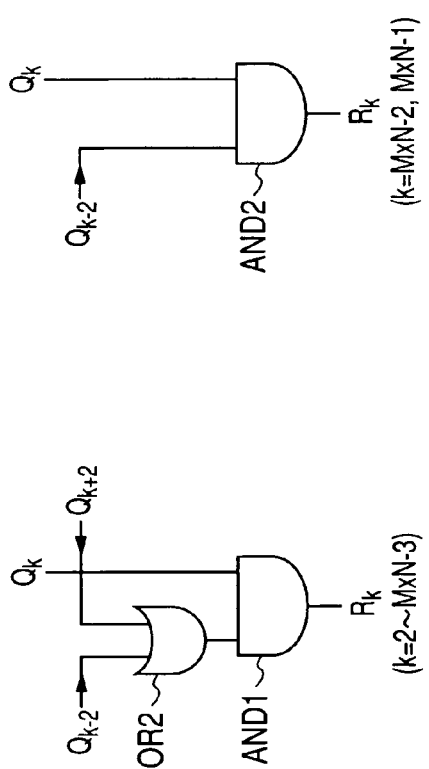
FIG. 15C is a view of another correction unit of the correcting circuit shown in FIG. 15A.
Figure 15B:
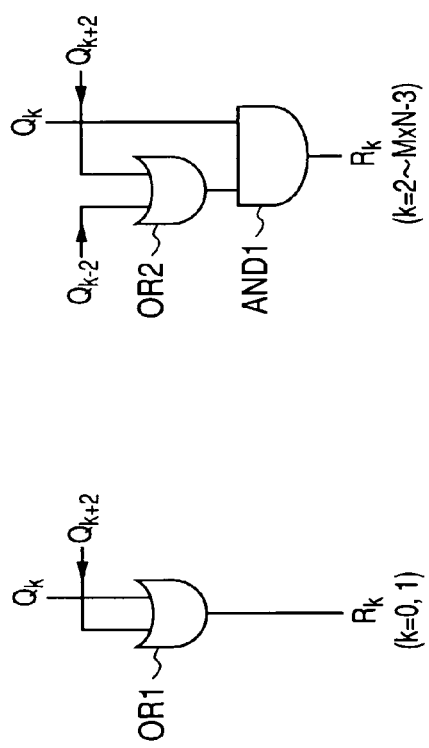
FIG. 15B is a view of a correction unit of the correcting circuit shown in FIG. 15A.

As shown in FIG. 15A, the circuit 9a has two first logical add (OR) circuits OR1 shown in FIG. 15B, M×N−4 pairs of second logical add (OR) circuits OR2 and first logical multiply (AND) circuits AND1 shown in FIG. 15C, and two second logical multiply (AND) circuits AND2 shown in FIG. 15D. Each first OR circuit OR1 performs the logical add for a specific bit $Q_k$ (k=0,1) to be checked and a reference bit $Q_{k+2}$ placed away from the bit $Q_k$ by two bit positions toward the rear side of the specific bit $Q_k$ and outputs a result of the logical add as a first correction bit $R_k$. Each second OR circuit OR2 performs the logical add for two reference bits $Q_{k-2}$ and $Q_{k+2}$ (k=2, - - -, M×N−3) placed away from a specific bit $Q_k$ by two bit positions toward the respective sides of the specific bit $Q_k$ and outputs a result of the logical add. Each first AND circuit AND1 performs the logical multiply for a specific bit $Q_k$ (k=2, - - -, M×N−3) and the output of the corresponding second circuit OR and outputs a result of the logical multiply as a first correction bit $R_k$. Each second AND circuit AND2 performs the logical multiply for a specific bit $Q_k$ (k=M×N−2, M×N−1) and a reference bit $Q_{k-2}$ placed away from the bit $Q_k$ by two bit positions toward the front side of the bit $Q_k$ and outputs a result of the logical multiply for the received bits as a first correction bit $R_k$.

With this structure of the first correcting circuit 9a, each of the specific bits $Q_k$ (k=0, - - -, M×N−1) is checked with reference to the reference bit(s) in the corresponding correction unit and is outputted as a correction bit $R_k$. More specifically, when each specific bit $Q_k$ (k=2, - - -, M×N−3) is set at the non-passing level (i.e., low level), the correction bit $R_k$ is necessarily set at the same level (i.e., low level) as that of the bit $Q_k$. Further, when each specific bit $Q_k$ (k=2, - - -, M×N−3) and at least one of the reference bits $Q_{k-2}$ and $Q_{k+2}$ are set at the passing level (i.e., high level) together, the correction bit $R_k$ is set at the same level (i.e., high level) as that of the bit $Q_k$. In contrast, when each specific bit $Q_k$ (k=2, - - -, M×N−3) is set at the passing level (i.e. high level) on condition that the reference bits $Q_{k-2}$ and $Q_{k+2}$ are set at the non-passing level (i.e., low level) together, the correction bit $R_k$ is set at the non-passing level (i.e., low level) different from that of the bit $Q_k$. That is, only the case where the reference bits $Q_{k-2}$ and $Q_{k+2}$ are set at the non-passing level (i.e., low level) together, the specific bit $Q_k$ set at the passing level is corrected to the non-passing level.

Further, only when the bit $Q_k$ (k=0, 1) is set at the non-passing level (i.e., low level) on condition that the reference bit $Q_{k+2}$ is set at the passing level (i.e., high level), the correction bit $R_k$ is set at the passing level (i.e., high level) different from that of the bit $Q_k$. In other case, the correction bit $R_k$ is set at the same level as that of the bit $Q_k$.

Moreover, only when the specific bit $Q_k$ (k=M×N−2, M×N−1) is set at the passing level (i.e., high level) on condition that the reference bit $Q_{k-2}$ is set at the non-passing level (i.e., low level), the correction bit $R_k$ is set at the non-passing level (i.e., low level) different from that of the bit $Q_k$. In other case, the correction bit $R_k$ is set at the same level as that of the bit $Q_k$. Therefore, the bits $R_k$ (k=0, - - -, M×N−1) of a piece of first correction data are obtained.

Figure 16A:
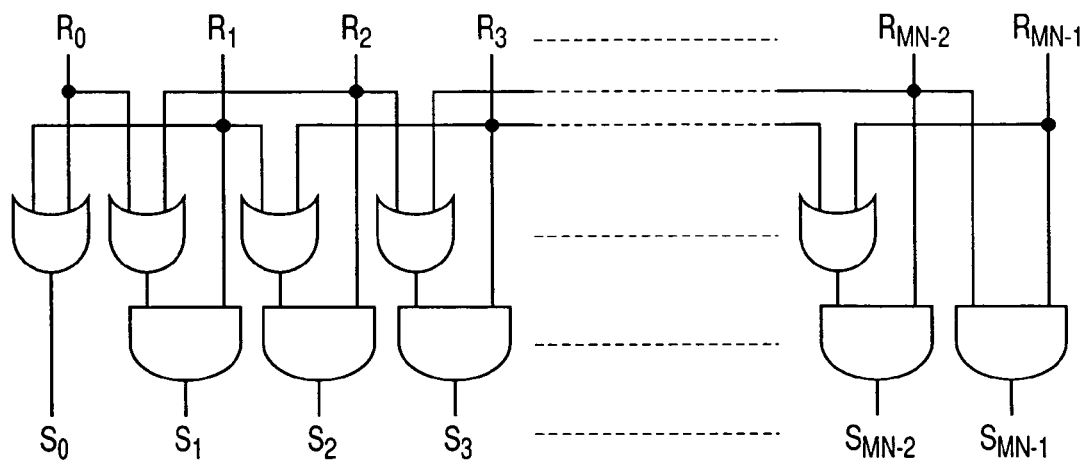
FIG. 16A is a view showing the structure of a second correcting circuit of the converter shown in FIG. 14.
Figure 16B:
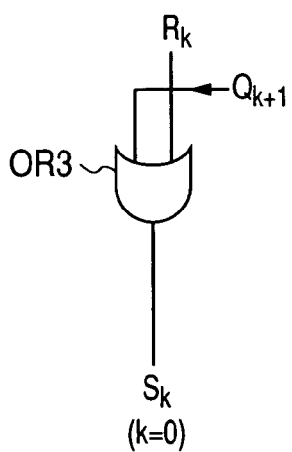
FIG. 16B is a view of a correction unit of the correcting circuit shown in FIG. 16A.
Figure 16C:
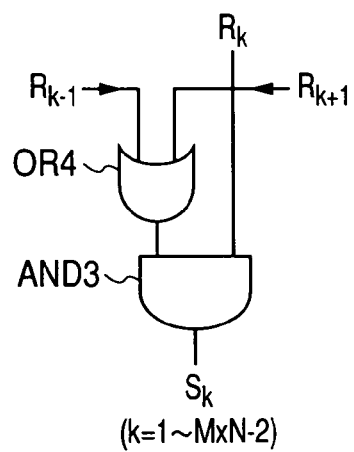
FIG. 16C is a view of another correction unit of the correcting circuit shown in FIG. 16A.
Figure 16D:
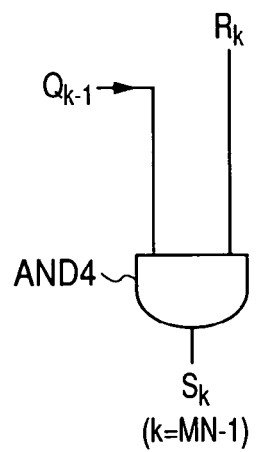
FIG. 16D is a view of another correction unit of the correcting circuit shown in FIG. 16A.

FIG. 16A is a view showing the structure of the second correcting circuit 9b of the converter 11. FIG. 16B is a view of a correction unit of the circuit 9b for each of the first bit $R_0$ of the combined data Q, FIG. 16C is a view of a correction unit of the circuit 9b for each of the middle bits $Q_k$ (k=1, - - -, M×N−2) of the combined data Q, and FIG. 16D is a view of a correction unit of the circuit 9b for the last bit $R_{MN-1}$ of the combined data Q.

As shown in FIG. 16A to FIG. 16D, the circuit 9b has a third logical add (OR) circuit OR3 which performs the logical add for a specific bit $R_k$ (k=0) to be checked and a reference bit $R_{k+1}$ adjacent to the bit $R_k$ on the rear side of the bit $R_k$ and outputs a result of the logical add as a second correction bit $S_k$, M×N−2 fourth logical add (OR) circuits OR4 each of which performs the logical add for reference bits $R_{k-1}$ and $R_{k+1}$ (k= 1, - - -, M×N−2) adjacent to a specific bit $R_k$ on the respective sides of the bit $R_k$ and outputs a result of the logical add, M×N−2 third logical multiply (AND) circuits AND3, corresponding to the respective circuits OR4, each of which performs the logical multiply for a specific bit $R_k$ (k=1, - - -, M×N−2) and the output of the corresponding circuit OR4 and outputs a result of the logical multiply as a second correction bit $S_k$, and a fourth logical multiply (AND) circuit AND4 which performs the logical multiply for a specific bit $R_k$ (k=M×N−1) and a reference bit $R_{k-1}$ adjacent to the bit $R_k$ on the front side of the bit $R_k$ and outputs a result of the logical multiply as a second correction bit $R_k$.

With this structure of the second correcting circuit 9b, each of the bits $R_k$ (k=0, - - -, M×N−1) in the first correction data is checked with reference to the reference bit(s) in the corresponding correction unit and is outputted as a second correction bit $S_k$. More specifically, when each specific bit $R_k$ (k= 1, - - -, M×N−2) is set at the non-passing level (i.e., low level) the correction bit $S_k$ is necessarily set at the same level (i.e., low level) as that of the bit $R_k$. Further, when each specific bit $R_k$ (k=1, - - -, M×N−2) and at least one of the reference bits $Q_{k-1}$ and $Q_{k+1}$ are set at the passing level (i.e., high level) together, the correction bit $S_k$ is set at the same level (i.e., high level) as that of the bit $R_k$. In contrast, when each specific bit $R_k$ (k=1, - - -, M×N−2) is set at the passing level (i.e., high level) on condition that the reference bits $Q_{k-1}$ and $Q_{k+1}$ are set at the non-passing level (i.e., low level) together, the correction bit $S_k$ is set at the non-passing level (i.e., low level) different from that of the bit $R_k$. That is, only the case where the reference bits $Q_{k-1}$ and $Q_{k+1}$ are set at the non-passing level (i.e., low level) together, the specific bit $S_k$ set at the passing level is corrected to the non-passing level.

Further, only when the bit $R_k$ (k=0) is set at the non-passing level (i.e., low level) on condition that the reference bit $R_{k+1}$ is set at the passing level (i.e., high level), the correction bit $S_k$ is set at the passing level (i.e., high level) different from that of the bit $R_k$. In other case, the correction bit $S_k$ is set at the same level as that of the bit $R_k$.

Moreover, only when the specific bit $R_k$ (k=M×N−1) is set at the passing level (i.e., high level) on condition that the reference bit $R_{k-1}$ is set at the non-passing level (i.e., low level), the correction bit $S_k$ is set at the non-passing level (i.e., low level) different from that of the bit $R_k$. In the other case, the correction bit $S_k$ is set at the same level as that of the bit $R_k$. Therefore, the bits $S_k$ (k=0, - - -, M×N−1) of a piece of second correction data are obtained.

In this correcting circuit 9, the combined data Q, for example, having a bit string of "--1110111000--" is corrected to the first correction data of $R_k$ having a bit string of "--1110101000--" in the first correcting circuit 9a and is corrected to the second correction data of $S_k$ having a bit string of "--1110000000--" in the second correcting circuit 9b. That is, all bits of "1" appearing after the first bit set at "0" are corrected to the binary digit "0" together.

More specifically, when one of the bits $Q_0$ and $Q_1$ to be correctly set at "1" together is erroneously set at "0" to form the combined data Q having a bit string of "10--" or "01--", the bit strings of "10--" and "01--" are, respectively, corrected to "1X--" (X denotes "1" or "0") and "X1--" in the circuit 9a, and the bit strings of "1X--" and "X1--" are corrected to "11--" together in the circuit 9b. When two bits $Q_0$ and $Q_1$ to be correctly set at "1" together are erroneously and serially set at "0" together to form the combined data Q having a bit string of "001--", the bit string of "001--" is corrected to "101--" in the circuit 9a, and the bit string of "101--" is corrected to "111--" in the circuit 9b. When one of the bits $Q_{MN-2}$ and $Q_{MN-1}$ to be correctly set at "0" together are erroneously set at "1" to form the combined data Q having a bit string of "--10" or "--01", the bit strings of "--10" and "--01" are, respectively, corrected to "--X0" and "--0X" in the circuit 9a, and the bit strings of "--X0" and "--0X" are corrected to "--00" together in the circuit 9b. When the bits $Q_{MN-2}$ and $Q_{MN-1}$ to be correctly set at "0" together are erroneously and serially set at "1" together to form the combined data Q having a bit string of "--01", the bit string of "--01" is corrected to "--010" in the circuit 9a, and the bit string of "--010" is corrected to "--000" in the circuit 9b. When one bit $Q_k$ (k=2, - - -, M×N−3) to be correctly set at "0" is erroneously set at "1" to form the combined data Q having a bit string of "-010-", the bit string of "-010-" is corrected to "-0X0-" in the circuit 9a, and the bit string of "-0X0-" is corrected to "-000-" in the circuit 9b. When two bits $Q_k$ and $Q_{k+1}$ (k=4, - - -, M×N−3) or three bits $Q_k$, $Q_{k+1}$ and $Q_{k+2}$ to be correctly set at "0" together are erroneously and serially set at "1" together to form the combined data Q having a bit string of "--01100-" or "--01110-", the bit strings of "--01100-" and "--01110-" are, respectively, corrected to "--0X000-" and "--01010-" in the circuit 9a, and the bit strings of "--0X000-" and "--01010-" are corrected to "--00000-" together in the circuit 9b.

Accordingly, even when there is bit error in the combined data Q such that the combined data Q has a plurality of bit boundaries, the combined data Q can be corrected to a piece of corrected data Qc having only one bit boundary. Therefore, the correcting circuit 9 can prevent the encoder 6 from producing numeral data not corresponding to a pulse position of the pulse signal PA.

In this embodiment, the correcting circuit 9 has two circuits 9a and 9b. However, when bit error only rarely occurs in a series of bits of the combined data Q, the correcting circuit 9 may have only the circuit 9b without using the circuit 9a. In this case, when one of the bits $Q_0$ and $Q_1$ to be correctly set at "1" together is erroneously set at "0", the bit strings of "10--" and "01--" in the combined data Q are, respectively, corrected to "11--" together in the circuit 9b. When one of the bits $Q_{MN-2}$ and $Q_{MN-1}$ to be correctly set at "0" together are erroneously set at "1", the bit strings of "--10" and "--01" in the combined data Q are, respectively, corrected to "--00" together in the circuit 9b. When one bit $Q_k$ (k=2, - - -, M×N−3) to be correctly set at "0" is erroneously set at "1", the bit string of "-010-" in the combined data Q is corrected to "-000-" in the circuit 9b.

Further, in this embodiment, the correcting circuit 9 receives the latched data from the holding circuits 5 as the combined data Q. However, the correcting circuit 9 may receive the latched data from the holding circuits 50 shown in FIG. 12 as the combined data Q.

Embodiment 4

Figure 17:
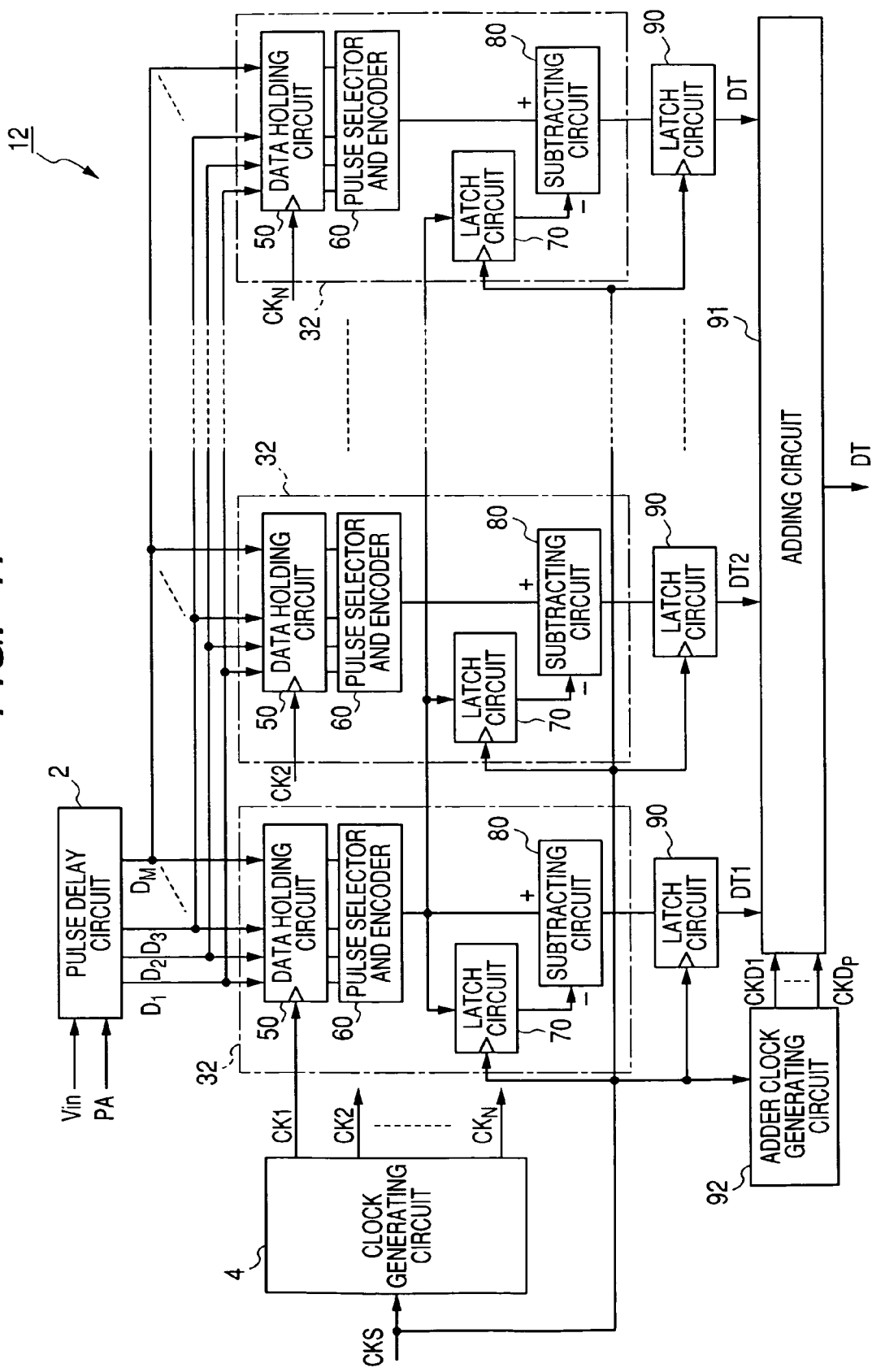
FIG. 17 is a block diagram of a TAD type A/D converter according to the fourth embodiment of the present invention.

FIG. 17 is a block diagram of an A/D converter according to the fourth embodiment.

As shown in FIG. 17, a TAD type A/D converter 12 has the pulse delay circuit 2, the clock generating circuit 4, N coding circuits 32 which receive the respective sampling clocks $CK_1$, $CK_2$, - - -, $CK_N$ from the circuit 4 and each of which latches the outputs D1 to $D_M$ of the circuit 2 in synchronization with the corresponding sampling clock $CK_j$ to hold M latched data corresponding to M values of M sampling points of the outputs D1 to $D_M$ and converts the M latched data into normalized numeral data $DT_j$ (j=1, 2, - - -, N), N latch circuits 90 each of which latches the numeral data of the corresponding coding circuits 32 in synchronization with the reference clock CKS and outputs the numeral data $DT_j$, an adder clock generating circuit 92 which generates P (P=[$\log_2$ (N)]; [X] indicates a value obtained by raising a fraction Fx of the value X, [X]=X+1−Fx when Fx>0, [X]=X when Fx=0) adder clocks $CKD_k$ (k=1, 2, - - -, P) from the reference clock CKS, and an adding circuit 91 which calculates a sum of the N pieces of normalized numeral data DT1 to $DT_N$ of the latch circuits 90 by using the adder clocks $CKD_k$ of the circuit 92 and outputs a result of the sum as A/D converted data DT. The data DT indicates a movement of the pulse signal PA corresponding to the level of the signal Vin. In this embodiment, $N=2^P$ is satisfied.

Therefore, the converter 12 is configured to latch the outputs D1 to $D_M$ of the circuit 2 at each of the N different sampling times at intervals of the unit time ΔT=Td/N in synchronization with the sampling clocks CK1 to $CK_N$, to convert M pieces of latched data corresponding to M values of M sampling points of the outputs D1 to $D_M$ latched at each sampling time into numeral data, and to calculate a sum of the N pieces of numeral data as A/D converted data DT. The A/D converted data DT is determined at a resolution corresponding to the unit time ΔT.

The j-th coding circuit 32 has a data holding circuit 51 that simultaneously latches the outputs D1 to $D_M$ of the circuit 2 at the sampling time of the sampling clock $CK_j$ every sampling period Ts to hold M pieces of latched data corresponding to M values of M sampling points of the outputs D1 to $D_M$ latched at the sampling time, a pulse selector and encoder 60 that converts the M pieces of latched data, which are arranged in an order corresponding to an arranging order of the M sampling points arranged in the pulse signal PA, into numeral data corresponding to a position of the pulse of the pulse signal PA in the delay circuit 2, a latch circuit 70 that latches the numeral data of the encoder 60 in synchronization with the reference clock CKS every sampling period Ts and outputs other numeral data latched just before the sampling period Ts, and a subtracting circuit 80 that subtracts the numeral data outputted from the latch circuit 70 from the numeral data of the encoder 60 every sampling period Ts to obtain normalized numeral data $DT_j$ corresponding to a movement of the pulse of the pulse signal PA.

Although the number of bits in the data processed in each of the encoder 60, the latch circuit 70 and the subtracting circuit 80 differs from that processed in the encoder 6, the latch circuit 7 or the subtracting circuit 8, the encoder 60, the latch circuit 70 and the subtracting circuit 80 are, respectively, configured in the same manner as the encoder 6, the latch circuit 7 and the subtracting circuit 8. That is, the operations in the encoder 60, the latch circuit 70 and the subtracting circuit 80 are substantially the same as those in the encoder 6, the latch circuit 7 and the subtracting circuit 8, respectively.

Figure 18:
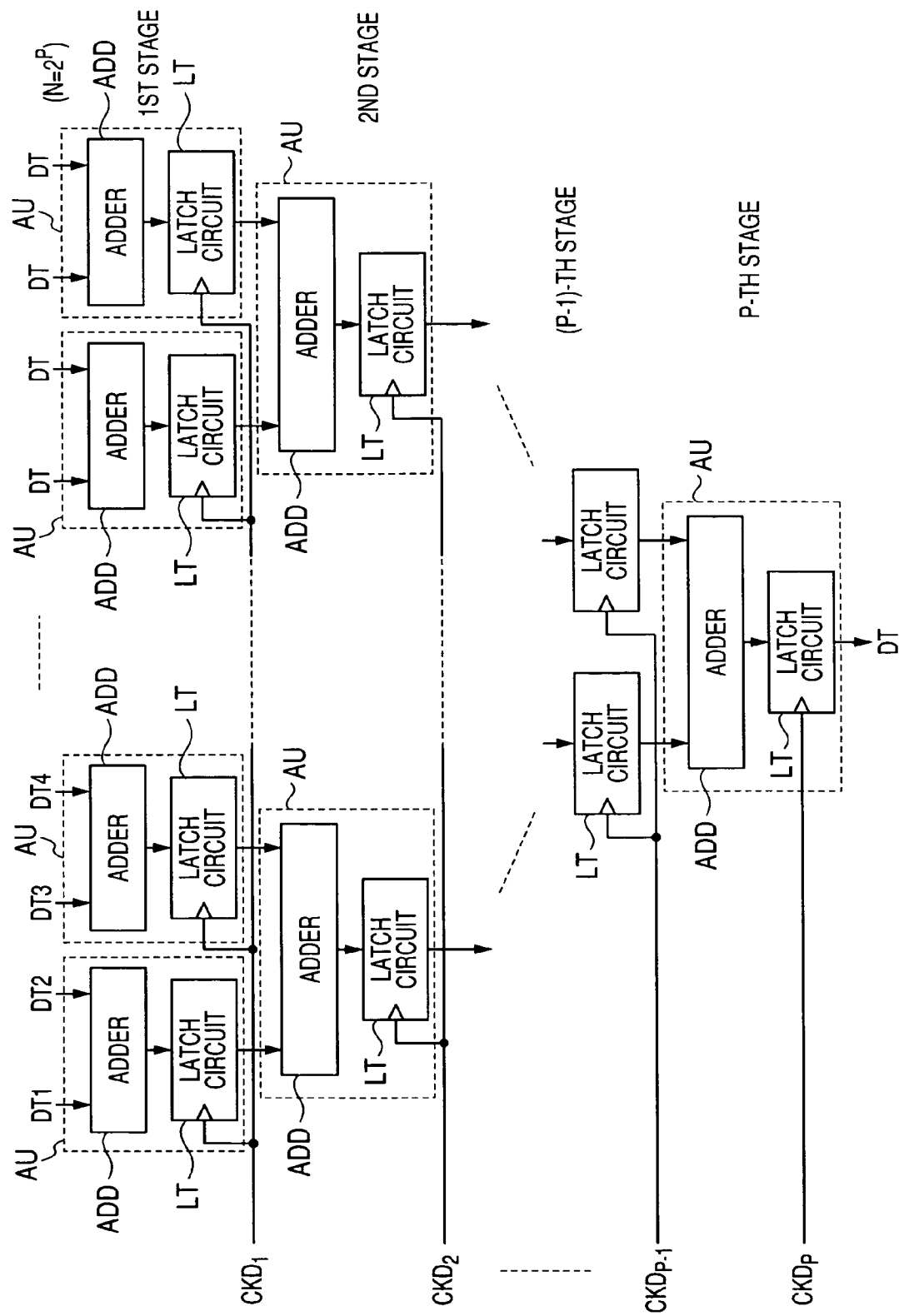
FIG. 18 is a block diagram of an adding circuit of the converter shown in FIG. 17.

FIG. 18 is a block diagram of the adding circuit 91. As shown in FIG. 18, the adding circuit 91 has a plurality of adder units AU of which the number equals a sum of $2^{P-1}$, $2^{P-2}$, - - - and $2^0$. The adder units AU are connected with one another to form a P-stage binary tree structure. In each k-stage (k=1, 2, - - - , P), there are $2^{P-k}$ adder units AU arranged in parallel to one another. Each adder unit AU of the k-stage has an adder ADD and a latch circuit LT. The adder ADD receives two pieces of numeral data and calculates a sum of the received data. In synchronization with the k-th adder clock $CKD_k$, the latch circuit LT latches the sum outputted from the corresponding adder ADD and outputs the sum to the corresponding adder ADD of the (k−1)-stage. In the first stage, the m-th (m=1, 2, - - - , N/2) adder ADD receives the normalized numeral data $DT_{2m-1}$ to $DT_{2m}$ to calculate a sum of the data $DT_{2m-1}$ to $DT_{2m}$.

In each adder ADD, $N_{ADD}$ gates circuits are serially arranged, so that each adder ADD needs a calculation delay time Tc to calculate a sum. The calculation delay time Tc substantially equals the period of time required by a signal passing through a critical path formed by the series of $N_{ADD}$ gates circuits. Therefore, the latching time indicated by the adder clock $CKD_k$ is set to be later than the latching time indicated by the adder clock $CKD_{k-1}$ by the calculation delay time Tc or more.

Figure 19:
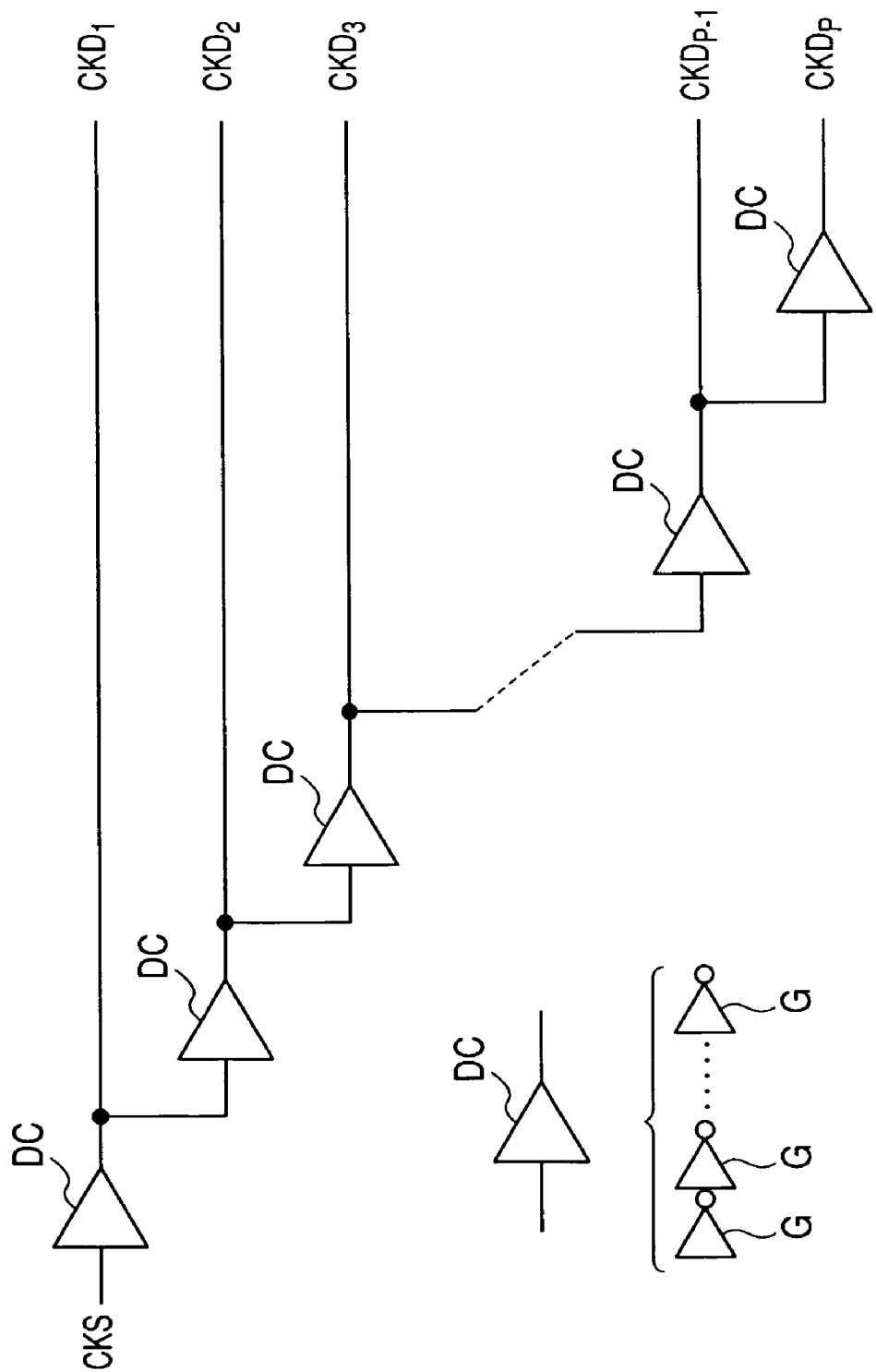
FIG. 19 is a block diagram of an adder clock generating circuit of the converter shown in FIG. 17.

FIG. 19 is a block diagram of the adder clock generating circuit 92. As shown in FIG. 19, the circuit 92 has P adder clock delay units DC serially arranged in P stages. The reference sampling clock CKS is first inputted to the delay unit DC of the first stage, is delayed in each delay unit DC and outputted from each delay unit DC. A signal outputted from the delay unit DC of the k-th stage (k=1, 2, - - - , P) is set as the adder clock $CKD_k$. Each delay unit DC is formed of a series of gate circuits G of which the number is larger than $N_{ADD}$ by a predetermined value ranging from one to five. A delay time of each gate circuit G substantially equals that of the adder ADD of the adding circuit 91. Therefore, the latching time indicated by the adder clock $CKD_k$ is set to be later than the latching time indicated by the adder clock $CKD_{k-1}$ by a predetermined period of time longer than the calculation delay time Tc.

Figure 20:
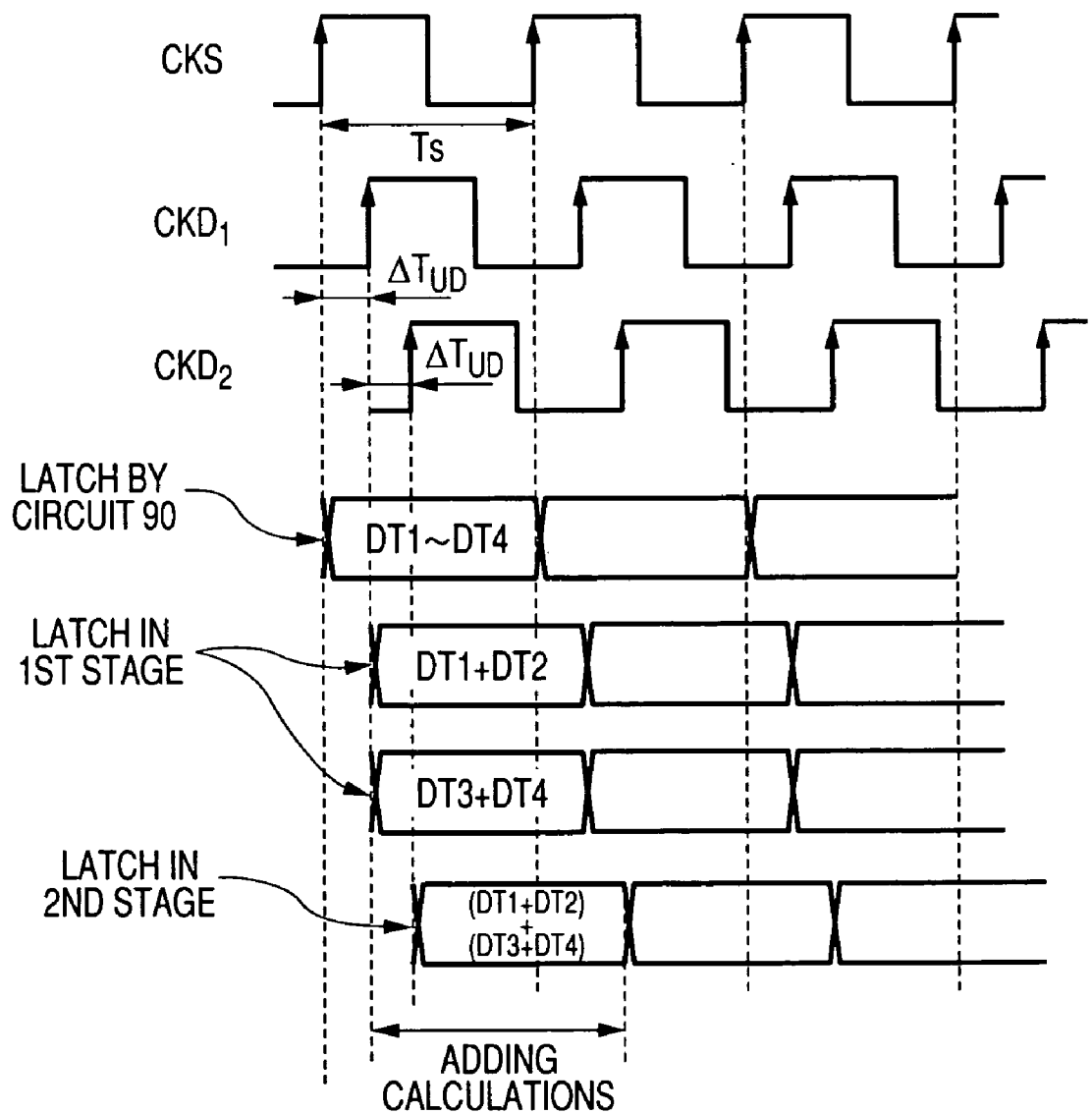
FIG. 20 is a timing chart of adding calculations performed in the adding circuit shown in FIG. 18.

FIG. 20 is a timing chart of adding calculations performed in the adding circuit 91 in case of N=4 and P=2. As shown in FIG. 20, each adder clock $CKD_k$ has a pulse every sampling period Ts, the latching time indicated by the adder clock $CKD_k$ is set at a time of the leading edge of the pulse every sampling period Ts. The leading edge of the adder clock $CKD_k$ is set to be later than the leading edge of the adder clock $CKD_{k-1}$ by a unit delay time $\Delta T_{UD}$ longer than the calculation delay time Tc and shorter than the sampling period Ts. The leading edge of the adder clock CKD1 is set to be later than the leading edge of the reference sampling clock CKS by the unit delay time $\Delta T_{UD}$.

The adders ADD of the first stage receive the data DT1 to DT4 in synchronization with the reference sampling clock CKS and calculates a sum of the data DT1 and DT2 and a sum of the data DT3 and DT4 within the calculation delay time Tc before the latching time indicated by the adder clock CKD1. In synchronization with one leading edge of the adder clock CKD1, the latch circuits LT of the first stage latch the respective sums and output the latched sums to the adder ADD of the second stage. These latched sums are held in the latch circuits LT until the circuits LT latch next sums. The adder ADD of the second stage calculates a sum of the data DT1 to DT4 within the calculation delay time Tc before the latching time indicated by the adder clock CKD2. In synchronization with one leading edge of the adder clock CKD2 later than the leading edge of the adder clock CKD1 by the unit delay time $\Delta T_{UD}$, the latch circuit LT of the second stage latches the sum of the corresponding adder ADD and outputs the sum as A/D converted data DT.

Therefore, the adder units AU of each k-stage start adding calculations in synchronization with the adder clock $CKD_{k-1}$ and hold results of the adding calculations in the latch circuits LT of the k-stage. Then, in synchronization with the adder clock $CKD_k$, the adder units AU output the results to the adder units AU of the next (k+1)-stage, so that the adder units AU of the (k+1)-stage start adding calculations. When the adder unit AU of the P-stage obtains a sum of all pieces of data DT1 and $DT_N$, the latch circuit LT of the adder unit AU outputs the sum as the A/D converted data DT in synchronization with the adder clock $CKD_P$.

Figure 2:
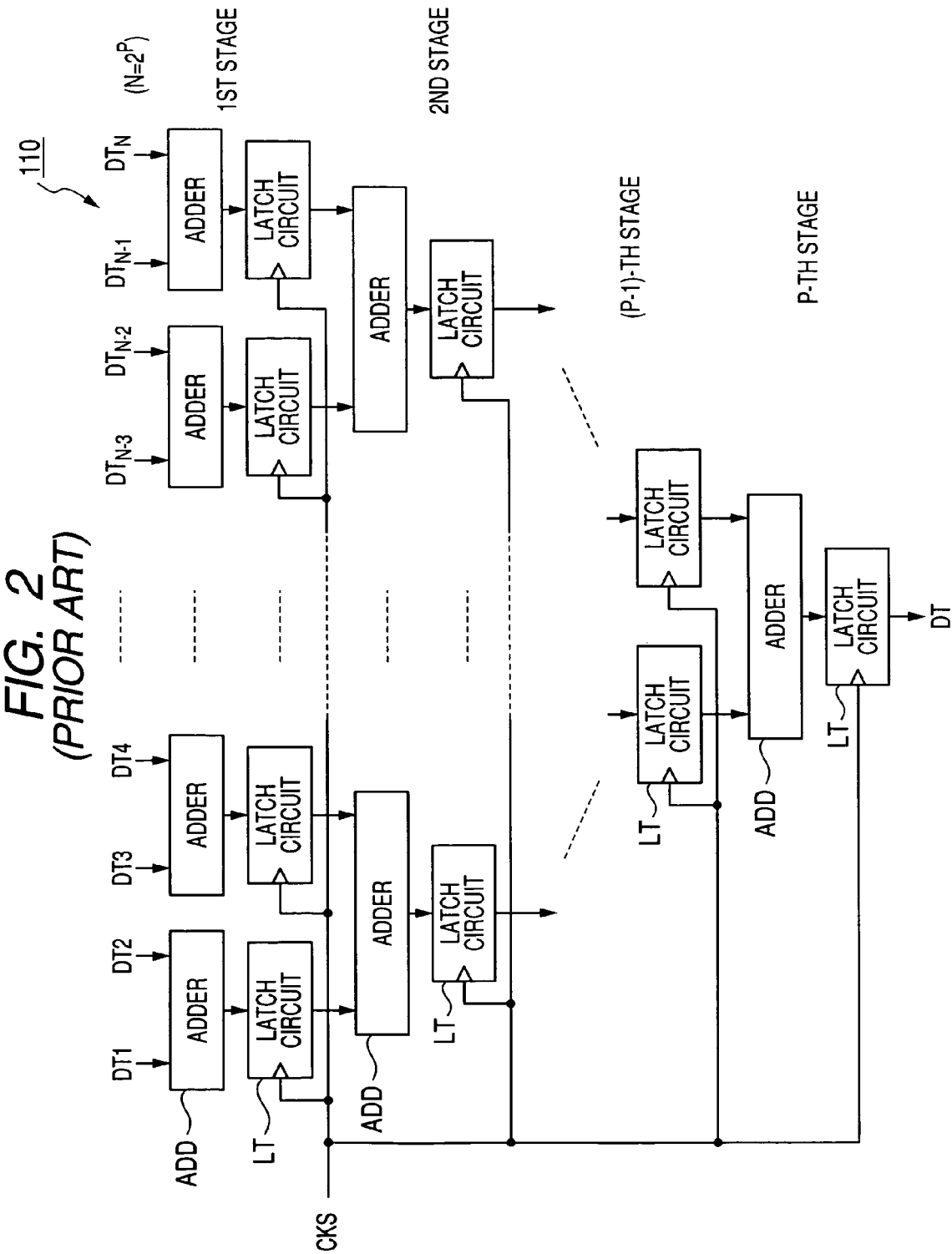
FIG. 2 is a schematic block diagram of an adding circuit of the converter shown in FIG. 1.
Figure 3:
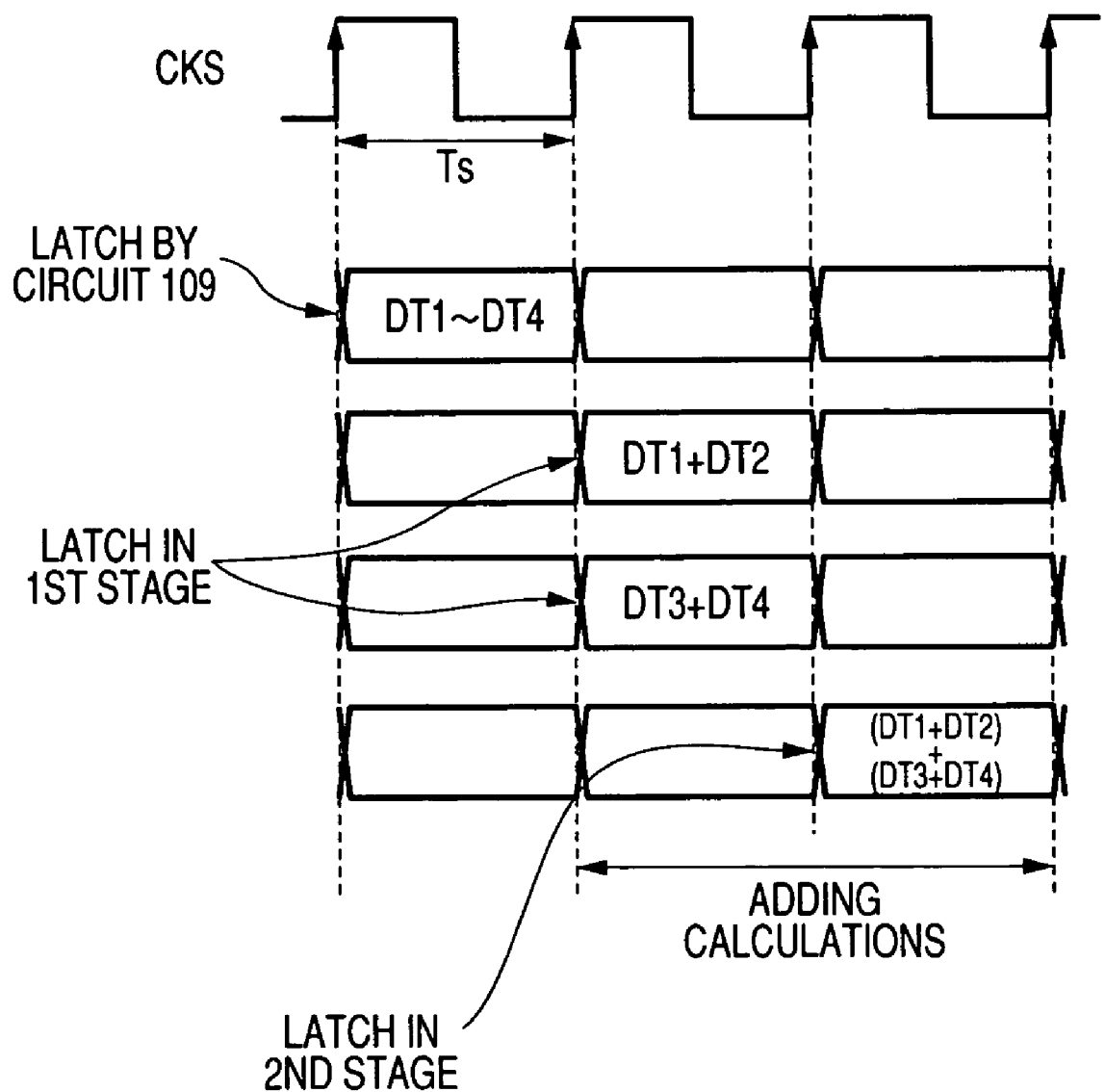
FIG. 3 is a timing chart of adding calculations performed in the adding circuit shown in FIG. 2.

That is, when the calculating circuit 91 receives the normalized numeral data DT1 and $DT_N$ in synchronization with the reference sampling clock CKS, the circuit 91 calculates the A/D converted data DT from the data DT1 and $DT_N$ and outputs the data DT at a time later than the clock CKS by a product $P \times \Delta T_{UD}$ of P and the unit delay time $\Delta T_{UD}$. The period of time $P \times \Delta T_{UD}$ in this embodiment is shorter than a period of time $P \times Ts$ required in the prior art (see FIG. 1 to FIG. 3).

Accordingly, because adding calculations in each stage of the circuit 91 are performed in the unit delay time $\Delta T_{UD}$ which is set as short as possible and is shorter than the sampling period Ts, an adding calculation time required in the circuit 91 can be considerably shortened as compared with that according to the prior art. Therefore, although the A/D converter 12 has the adding circuit 91 configured in the binary tree structure to obtain the A/D converted data DT at higher resolution (i.e., with higher precision) in the same manner as in the prior art, the converter 12 can be used to execute application programs requiring the feed-back of A/D converted data at high speed, and a servo control in a vehicle can be performed at high speed.

In this embodiment, the latching times indicated by the adder clocks $CKD_k$ are set at equal intervals of the unit delay time $\Delta T_{UD}$. However, the latching times indicated by the adder clocks $CKD_k$ maybe set at different intervals on condition that each interval is longer than the calculation delay time Tc and is shorter than the sampling period Ts.

Embodiment 5

Figure 21:
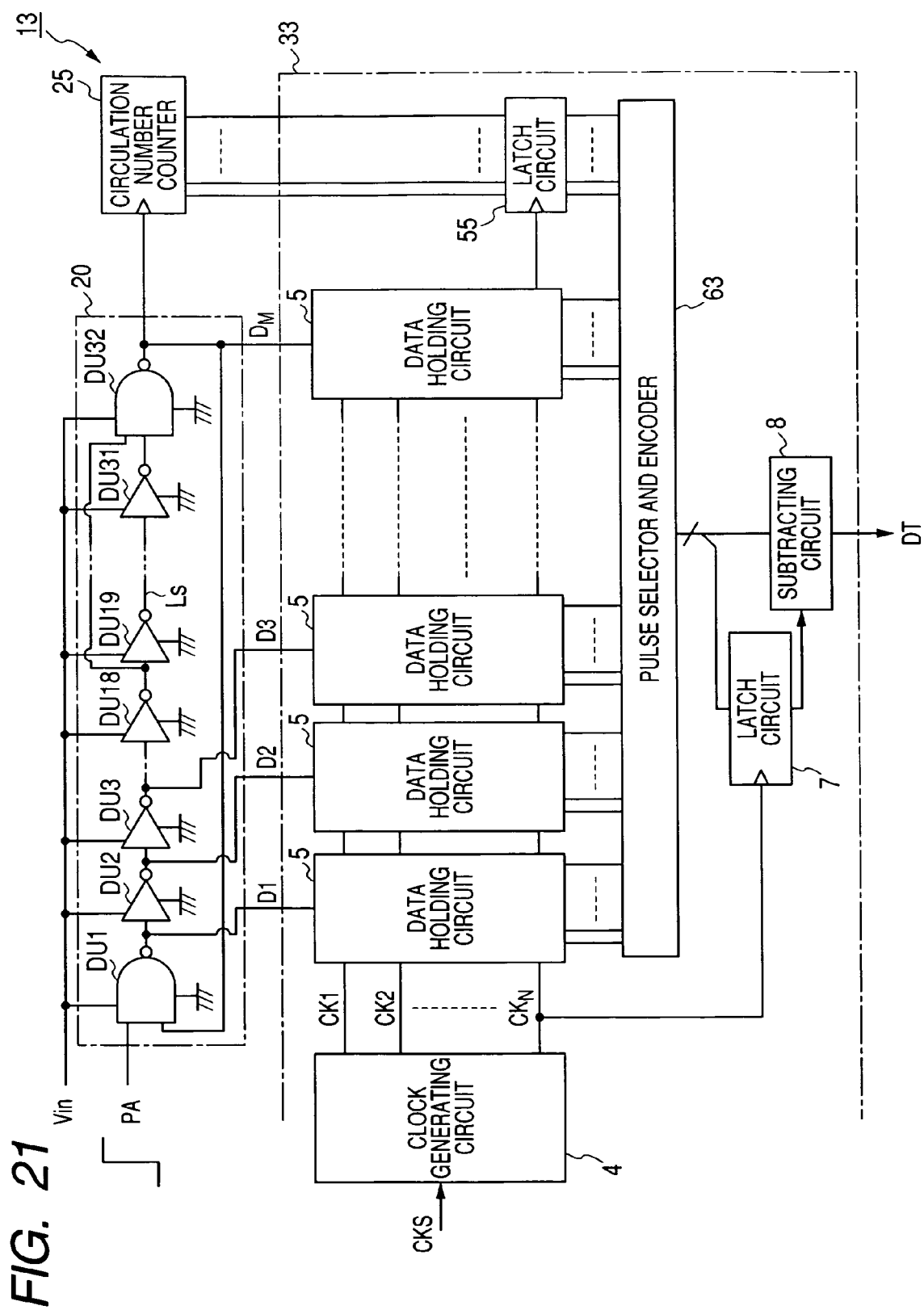
FIG. 21 is a block diagram of a TAD type A/D converter according to the fifth embodiment of the present invention.

FIG. 21 is a block diagram of an A/D converter according to the fifth embodiment.

As shown in FIG. 21, a TAD type A/D converter 13 has a pulse delay circuit 20, a circulation number counter 25, and a coding circuit 33. The circuit 20 has M (M is an integer equal to or higher than 2, in this embodiment M=$2^5$) delay units DU (DU1 to DU32) arranged in a ring shape to repeatedly circulate the pulse signal PA while delaying the signal PA in each delay unit DU. Preferably, the value M equals the s-th power of 2 (M=$2^s$; s is an integer). The counter 25 increments a counted value by one each time the level of a signal received from the circuit 20 is changed from the low level to the high level. The counted value is initially set at zero.

The delay units DU simultaneously receive an analog input signal (i.e., voltage signal) Vin as a driving voltage and have the same delay time Td corresponding to a voltage level of the signal Vin. As the level of the signal Vin is heightened, the delay time Td is shortened. The pulse signal PA passes through a signal transmission line Ls on which the delay units DU are arranged in a ring shape.

The circuit 20 has two NAND gates DU1 and DU32 and an even number of inverters DU2 to DU31 arranged in a ring shape as the delay units DU. The NAND gate DU1 receives the pulse signal PA and an output of the NAND gate DU32 and outputs a result of the negative AND operation to the inverter DU2. The inverters DU2 to DU31 are serially disposed in that order. The NAND gate DU32 receives outputs of the inverters DU18 and DU31.

With this structure of the circuit 20, when no pulse of the pulse signal exists in the circuit 20 (i.e., when the level of the signal PA is low), the signal received in the counter 25 is set to the high level.

When the signal PA is changed to the high level, a main pulse edge circulates the gate DU1, the inverters DU2 to DU31 and the gate DU2 in that order, and a reset pulse edge circulates the gate DU1, the inverters DU2 to DU18 and the gate DU2 in that order. The main pulse edge induces each of the gate DU1 and the inverters DU3, DU5, - - -, DU31 of the odd-numbered stages to change the output from the high level to the low level and induces each of the inverters DU2, DU4, - - -, DU30 and the gate DU32 of the even-numbered stages to change the output from the low level to the high level. The reset pulse edge induces each of the gate and inverters of the odd-numbered stages to change the output from the low level to the high level and induces each of the inverters and gate of the even-numbered stages to change the output from the high level to the low level.

Therefore, the counter 25 can count a circulation number of the pulse SA repeatedly circulated in the circuit 20.

The structure and operation of the circuit 20 and the counter 25 are described in detail in Published Japanese Patent First Publication No. H06-216721. Therefore, further descriptions of the circuit 20 and the counter 25 are omitted.

The coding circuit 33 produces A/D converted data DT from outputs D1 to $D_M$ of the delay units DU and an output of the counter 25. The coding circuit 33 has the clock generating circuit 4, the data holding circuits 5 corresponding to the respective delay units DU, a latch circuit 55 latching the circulation number of the counter 25 in synchronization with the sampling clock $CK_N$ of the circuit 4, a pulse selector and encoder 63, the latch circuit 7 latching the combined data, and the subtracting circuit 8.

The encoder 63 receives the M×N pieces of latched data from the circuits 5 as the single piece of combined data Q in a lump in the same manner as in the encoder 6 shown in FIG. 4, converts the combined data Q into numeral data indicating a pulse position of the signal PA at one time, and produces mixed data indicating a movement of the pulse signal PA from the circulation number and the numeral data. The mixed data is obtained by placing binary data of the circulation number at higher bit positions of the mixed data and by placing the numeral data at lower bit positions of the mixed data.

Therefore, the converter 13 can output the data DT corresponding to the level of the analog signal Vin.

Figure 22:
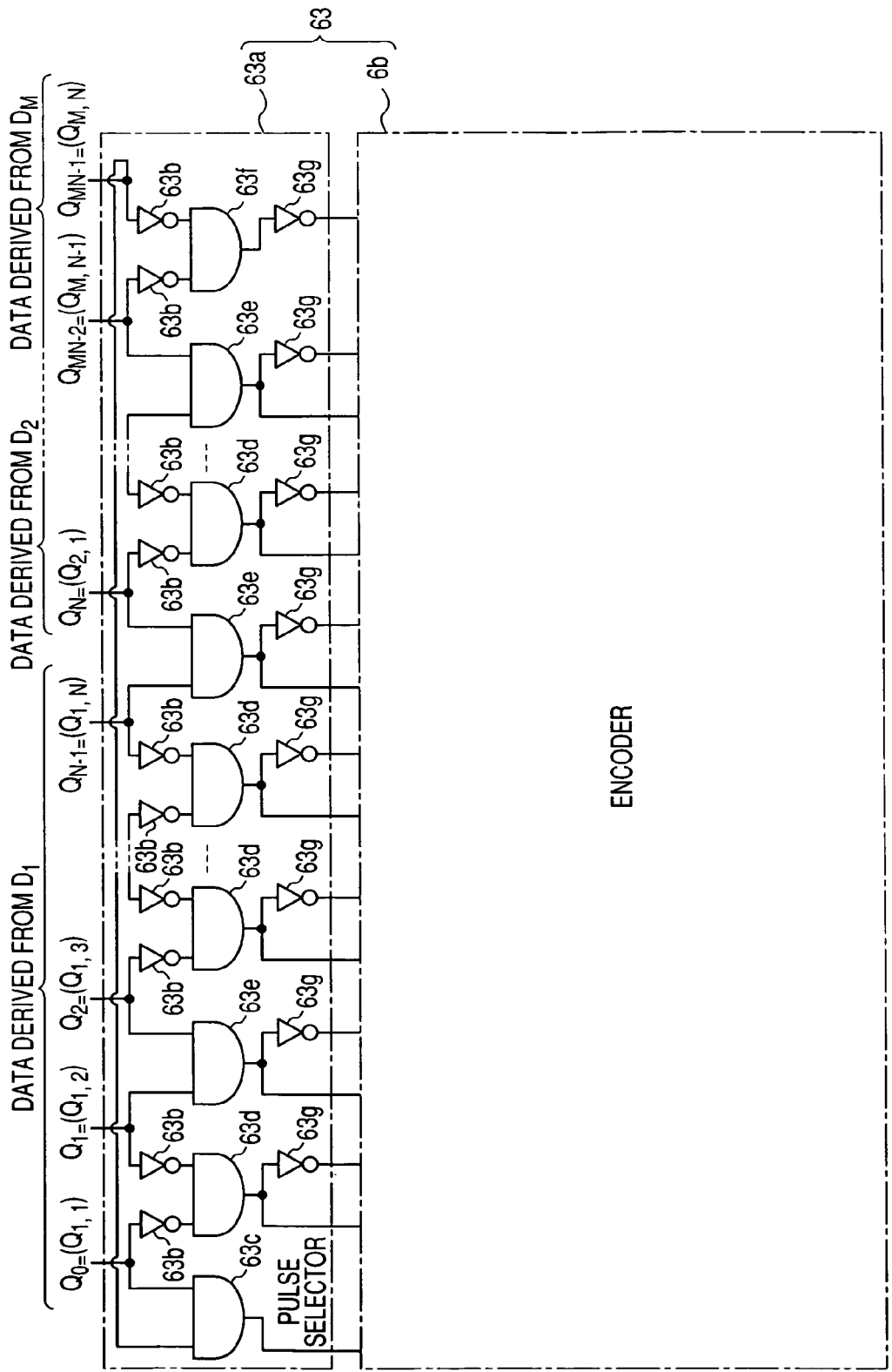
FIG. 22 is a circuit view showing the structure of a pulse selector and encoder of the converter shown in FIG. 21.

The structure and operation of the pulse selector and encoder 63 is described with reference to FIG. 22. FIG. 22 is a circuit view showing the structure of the encoder 63.

As shown in FIG. 22, the encoder 63 has a pulse selector 63a and the encoder 6b. To specify a position of the bit boundary in the combined data Q (having bits $Q_0$ to $Q_{MN-1}$) derived from the outputs D1 to $D_M$ of the delay unit 20, the pulse selector 63a has M×N first inverters 63b inverting the respective bits $Q_0$ to $Q_{MN-1}$, a first AND circuit 63c, M×N/2−1 second AND circuits 63d, M×N/2−1 third AND circuits 63e, a fourth AND circuit 63f, M×N/2−1 second inverters 63g corresponding to the respective AND circuits 63d, M×N/2−1 third inverters 70 corresponding to the respective AND circuits 63e, and a fourth inverter 71.

The AND circuit 63c receives the bits $Q_{MN-1}$ and $Q_0$ and outputs a result of the AND operation for the received bits as the first position output P0 to the encoder 63. Each AND circuit 63d receives the bits $Q_{2k-2}$ and $Q_{2k-1}$ (k=1 to M×N/2−1) inverted by the corresponding inverters 63b and outputs a result of the AND operation for the received bits to the encoder 6b as a non-inverted output of the position output $P_{2k-1}$. Each inverter 63g corresponding to the AND circuit 63d receiving the bits $Q_{2k-2}$ and $Q_{2k-1}$ inverts the output of the AND circuit 63d and outputs the inverted result as an inverted output of the position output $P_{2k-1}$. Each AND circuit 63e receives the bits $Q_{2k-1}$ and $Q_{2k}$ (k=1 to M×N/2−1) and outputs a result of the AND operation for the received bits to the encoder 6b as a non-inverted output of the position output $P_{2k}$. Each inverter 70 corresponding to the AND circuit 63e receiving the bits $Q_{2k-1}$ and $Q_{2k}$ inverts the output of the AND circuit 63e and outputs the inverted result as an inverted output of the position output $P_{2k}$. The AND circuit 63f receives the bits $Q_{MN-2}$ and $Q_{MN-1}$ inverted by the corresponding inverters 63b and outputs a result of the AND operation for the received bits. The inverter 71 inverts the output of the AND circuit 63f and outputs the inverted result to the encoder 6b as the position output $P_{MN-1}$.

Therefore, the encoder 6b outputs numeral data indicating the pulse position of the signal PA in the delay circuit 20.

The pulse selector and encoder 63 produces mixed data which has data of the circulation number at higher bit positions and the output (i.e., numeral data indicating a pulse position of the signal PA) of the encoder 6b at lower bit positions. Therefore, A/D converted data DT produced in the circuit 8 corresponds to the level of the analog input signal Vin received in the circuit 20.

Because the converter 13 has the pulse delay circuit 20 and the counter 25, the number of delay units DU can be considerably reduced while the A/D converted data DT is calculated with high precision in the same manner as in the converter 1 shown in FIG. 4. Further, because the number of delay units DU is reduced, the number of data holding circuits 5 can be considerably reduced. Accordingly, the A/D converter can be downsized.

In this embodiment, because the value M equals the s-th power of 2, the circulation number counted in the counter 25 can be used as upper bits of the mixed data outputted from the encoder 63. However, when the value M differs from the s-th power of 2, it is required that the encoder 63 adjusts the circulation number according to the number M and produces mixed data which has data of the adjusted circulation number at higher bit positions and the output of the encoder 6b at lower bit positions.

Further, in this embodiment, the holding circuits 50 shown in FIG. 12 may be disposed in the converter in place of the holding circuits 5, or the correcting circuit 9 shown in FIG. 14 may be additionally disposed in the converter. Further, the converter 12 shown in FIG. 17 may have the delay circuit 20, the counter 25 and the latch 55 in place of the delay circuit 2 while replacing the encoders 60 with encoders producing the mixed data.

For example, when the correcting circuit 9 is applied for the converter 13, a correction unit of the first correcting circuit 9a for each specific bit $Q_k$ (k=0, 1) is modified to another correction unit shown in FIG. 15C so as to correct the bit $Q_k$ according to the reference bits $Q_{MN-2+k}$ and $Q_{k+2}$, and a correction unit of the first correcting circuit 9a for each specific bit $Q_k$ (k=M×N−2, M×N−1) is modified to another correction unit shown in FIG. 15C so as to correct the bit $Q_k$ according to the reference bits $Q_{k-2}$ and $Q_{k+2-MN}$. Further, a correction unit of the second correcting circuit 9b for the specific bit $Q_0$ is modified to another correction unit shown in FIG. 15C so as to correct the bit $Q_0$ according to the reference bits $Q_{MN-1}$ and $Q_1$, and a correction unit of the second correcting circuit 9b for the specific bit $Q_{MN-1}$ is modified to another correction unit shown in FIG. 15C so as to correct the bit $Q_{MN-1}$ according to the reference bits $Q_{MN-2}$ and $Q_0$.

Embodiment 6

In the fifth embodiment, the delay circuit 20 has the even-numbered delay units DU. However, a delay circuit may have odd-numbered delay units DU.

Figure 23:
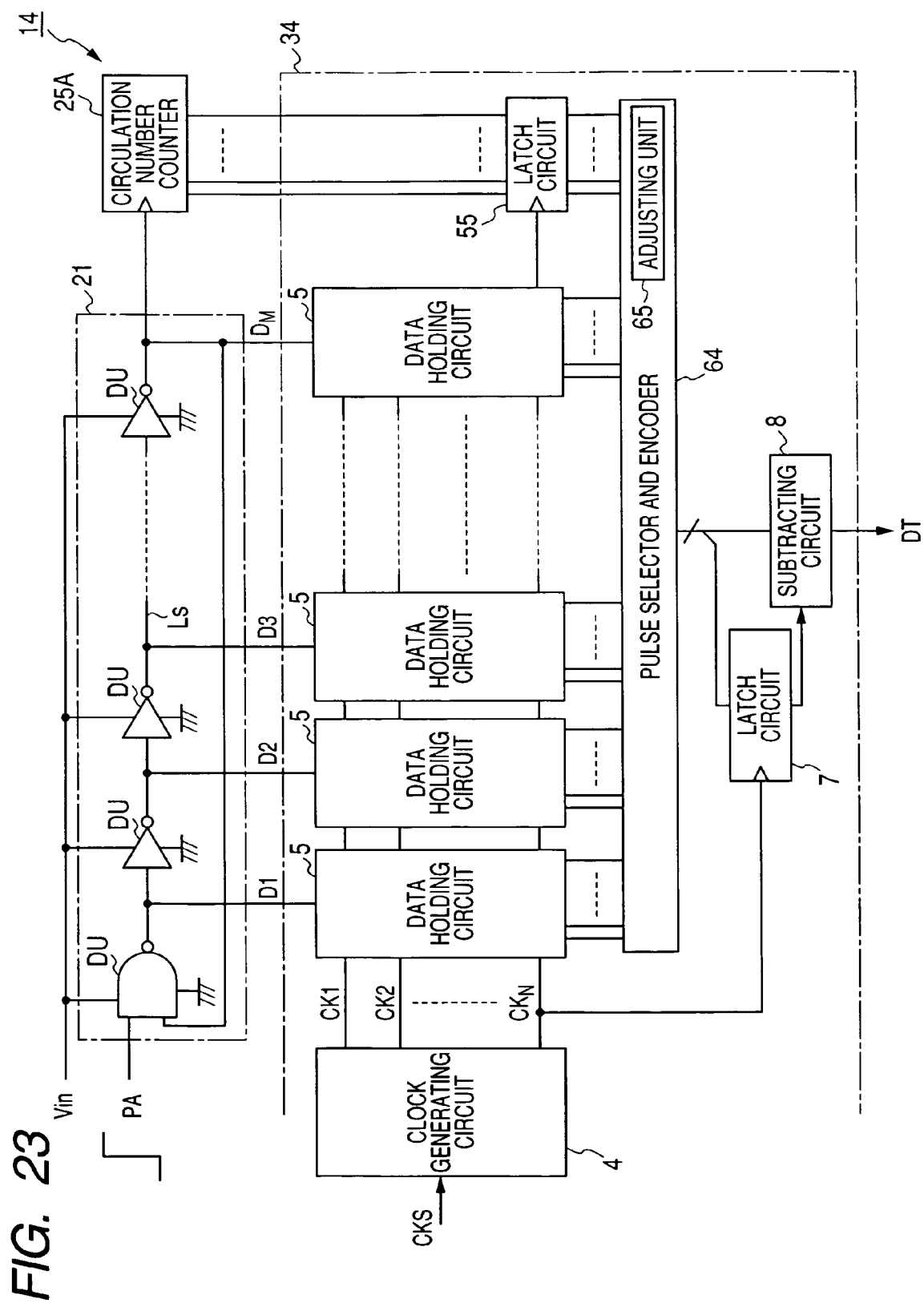
FIG. 23 is a block diagram of a TAD type A/D converter according to the sixth embodiment.

FIG. 23 is a block diagram of an A/D converter according to the sixth embodiment.

As shown in FIG. 23, a TAD type A/D converter 14 has a pulse delay circuit 21, a circulation number counter 25A, and a coding circuit 34. The circuit 21 has M (M is an odd number equal to or higher than 3) delay units DU arranged in a ring shape to repeatedly circulate the pulse signal PA while delaying the signal PA in each delay unit DU. The counter 25A increments a counted value by one each time the level of a signal received from the circuit 21 is changed. The counted value is initially set at zero. The coding circuit 34 produces A/D converted data DT from outputs D1 to $D_M$ of the delay units DU and an output of the counter 25A.

The delay units DU of the delay circuit 21 simultaneously receive an analog input signal (i.e., voltage signal) Vin as a driving voltage and have the same delay time Td corresponding to a voltage level of the signal Vin. As the level of the signal Vin is heightened, the delay time Td is shortened. The pulse signal PA passes through a signal transmission line Ls on which the delay units DU are arranged in a ring shape.

The circuit 21 has an NAND gate of the first stage and a plurality of inverters serially arranged as the delay units DU. The NAND gate DU receives the pulse signal PA and an output of the inverter of the final (i.e., M-th) stage and outputs a result of logical multiply. This result is inverted in each of the inverters DU. When no pulse of the pulse signal exists in the circuit 21 (i.e., when the signal PA set at the low level is inputted to the AND gate DU), an output terminal (i.e., input terminal of the NAND gate DU) of the inverter DU of the final stage is set to the high level. When the signal PA is changed to the high level at a start time T0, the output level of the NAND gate DU is changed. In response to this change in the NAND gate DU, the output level of the final inverter DU is changed. In response to this change in the final inverter DU, the output level of the NAND gate DU is changed. That is, each time one circulation period of time equal to M×Td is elapsed after the start time T0, the output level of the final inverter DU is changed. Therefore, the counter 25A counts a circulation number of the pulse SA repeatedly circulated in the circuit 20.

The coding circuit 34 has the clock generating circuit 4, the data holding circuits 5 corresponding to the respective delay units DU, the latch circuit 55 latching the circulation number of the counter 25A in synchronization with the sampling clock $CK_N$ of the circuit 4, a pulse selector and encoder 64, the latch circuit 7 latching the combined data produced in the encoder 64, and the subtracting circuit 8.

The encoder 64 receives the M×N pieces of latched data from the circuits 5 as the single piece of combined data Q in a lump in the same manner as in the encoder 6 shown in FIG. 4, converts the combined data Q into numeral data indicating a pulse position of the signal PA at one time, and produces mixed data from data of the circulation number and the numeral data.

In this production of the mixed data, because the number of delay units DU is odd and differs from a value $2^s$ (s is an integer), a binary number obtained from data of the circulation number placed at higher bit positions and the numeral data placed at lower bit positions does not indicate a movement of the pulse signal PA. Therefore, it is required to adjust the circulation number counted in the counter 25A. The encoder 64 has an adjusting unit 65, and the circulation number is adjusted to an adjusted circulation number in the adjusting unit 65. The encoder 64 produces the mixed data indicating a movement of the pulse signal PA from the adjusted circulation number at higher bit positions and the numeral data at lower bit positions.

Therefore, the converter 14 can output the data DT corresponding to the level of the analog signal Vin.

Figure 24:
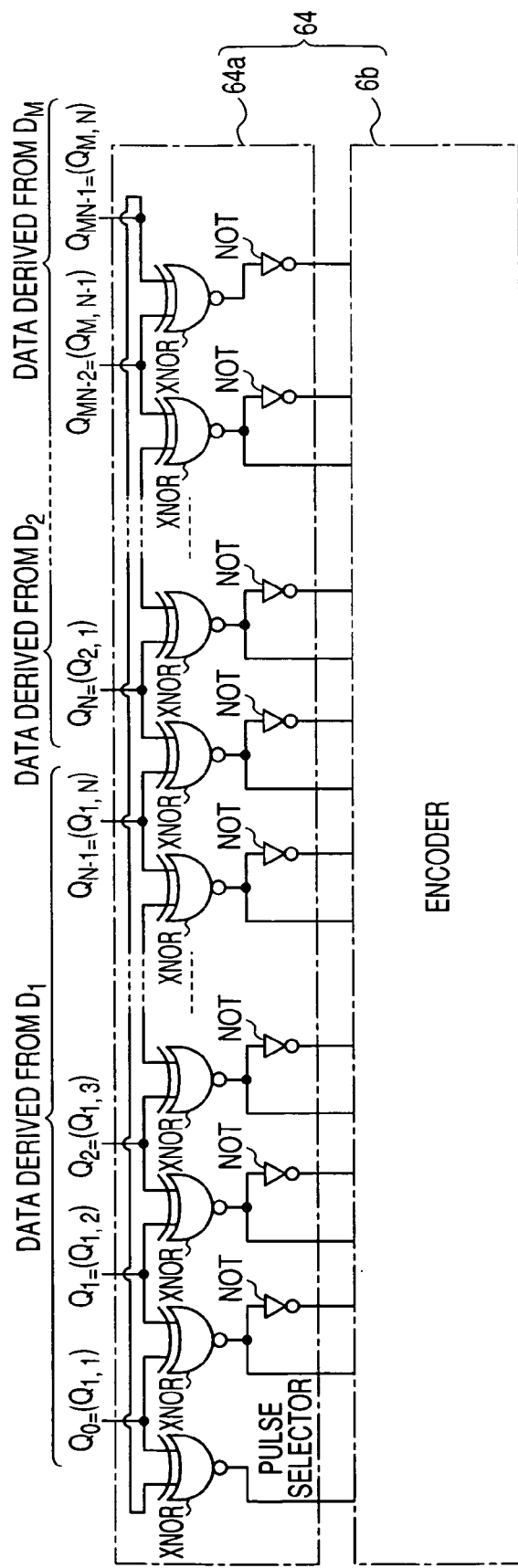
FIG. 24 is a circuit view showing the structure of a pulse selector and encoder of the converter shown in FIG. 23.

The structure and operation of the pulse selector and encoder 64 is described with reference to FIG. 24. FIG. 24 is a circuit view showing the structure of the encoder 64.

As shown in FIG. 24, the encoder 64 has a pulse selector 64a and the encoder 6b. To specify a position of the bit boundary in the combined data Q (having bits $Q_0$ to $Q_{MN-1}$) derived from the outputs D1 to DM of the delay unit 21, in the same manner as in the pulse selector 61a shown in FIG. 11, the pulse selector 64a has M×N−1 exclusive negative OR circuits XNOR, each of which receives two bits $Q_{k-1}$ and $Q_k$ (k=1,2, - - - , M×N−1), and M×N−1 inverters NOT corresponding to the circuits XNOR to output M×N−1 position outputs $P_k$ to the encoder 6b Further, because the pulse signal PA is repeatedly circulated in the circuit 21, the pulse selector 64a further has an exclusive negative OR circuit XNOR that receives values of the bits $Q_0$ and $Q_{MN-1}$ and outputs a result of an exclusive NOR operation for values of the received bits to the encoder 6b as a non-inverted output of a position output $P_0$.

Therefore, the encoder 6b can output the numeral data indicating a pulse position of the signal PA in the delay circuit 21.

Because the converter 14 has the pulse delay circuit 21 and the counter 25A, the number of delay units DU can be considerably reduced while the A/D converted data DT is calculated with high precision in the same manner as in the converter 1 shown in FIG. 4. Further, because the number of delay units DU is reduced, the number of data holding circuits 5 can be considerably reduced. Accordingly, the A/D converter can be downsized.

Embodiment 7

Figure 25:
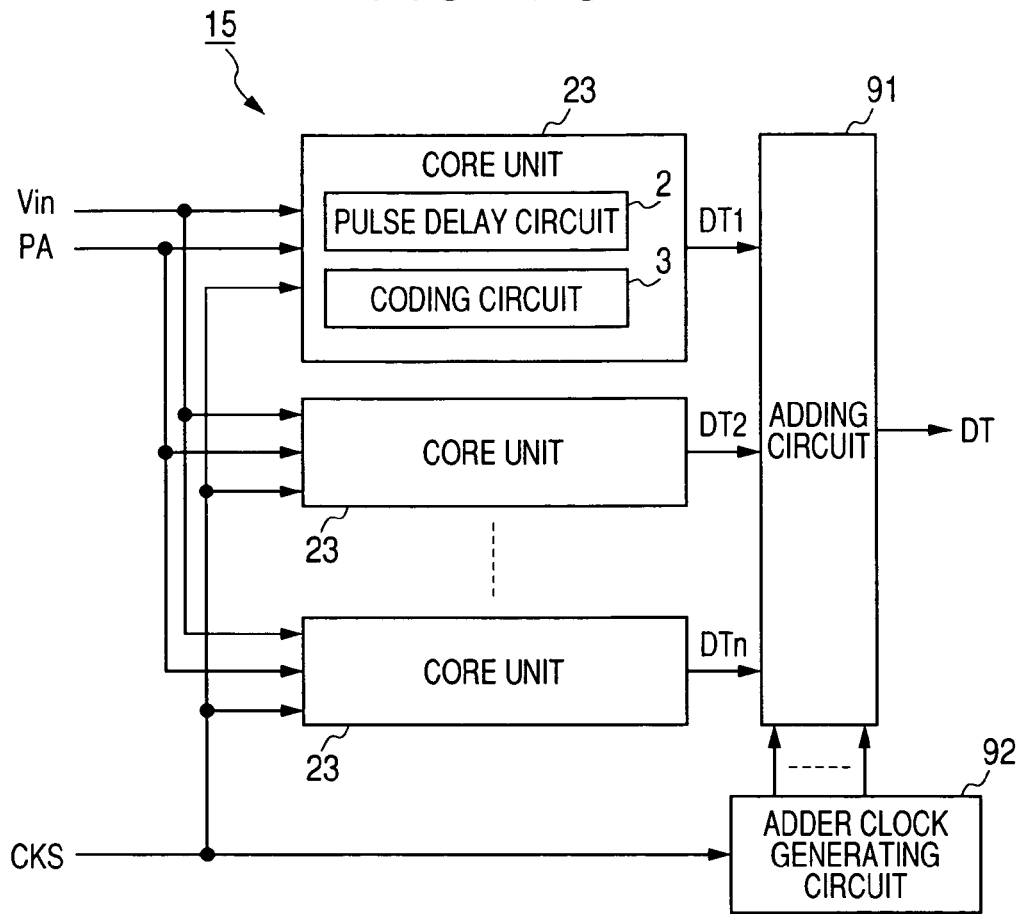
FIG. 25 is a block diagram of a TAD type A/D converter according to the seventh embodiment of the present invention.

FIG. 25 is a block diagram of an A/D converter according to the seventh embodiment.

As shown in FIG. 25, a TAD type A/D converter 15 has N (N is an integer equal to or higher than 2) core units 23 arranged in parallel to one another, the adder clock generating circuit 92 and the adding circuit 91. Each core unit 23 has the pulse delay circuit 2 and the coding circuit 3 having the same structure as those shown in FIG. 4 according to the first embodiment. The circuits 91 and 92 have the same structure as those shown in FIG. 17 according to the fourth embodiment. The core unit 23 of the j-th stage (j=1, 2, - - - , N)

converts the voltage level of the analog signal Vin into A/D converted data DTj corresponding to the voltage level.

The group of sampling times specified by the sampling clocks $CK_1$ to $CK_{N1}$ (N1 is an integer equal to or higher than 2) in the circuit 4 of each core unit 23 is differentiated from those in the other core units 23. Alternatively, the relationship between the delay time Td and the level of the signal Vin in the delay circuit 2 of each core unit 23 is differentiated from those in the other core units 23. Therefore, a value the delay time Td in each core unit 23 differs from values of the delay times Td in the other core units 23. Therefore, the A/D converted data DTj of each core unit 23 is differentiated from those in the other core units 23. The adding circuit 91 produces A/D final converted data DT in the same manner as in the fourth embodiment shown in FIG. 17.

The converter 15 has the core units 23 having the same structure. Therefore, the structure of the converter 15 can be simplified. Further, the number of bits in the A/D final converted data DT is larger than the A/D converted data DTj in each core unit 23. Therefore, as compared with the pulse position specified by the A/D converted data DTj, the converter 15 can specify the pulse position of the pulse signal PA in higher resolution. Accordingly, as compared with the converter 1 shown in FIG. 4, the converter 15 can obtain A/D converted data with higher precision.

In this embodiment, each core unit has the converter 4. However, the core units may have the respective converters 10, 11, 12 or 13. Further, the converter of one core unit maybe differentiated from the converter of another core unit.

These embodiments should not be construed as limiting the present invention to structures of those embodiments, and the structure of this invention may be combined with that based on the prior art.

Figure 26A:
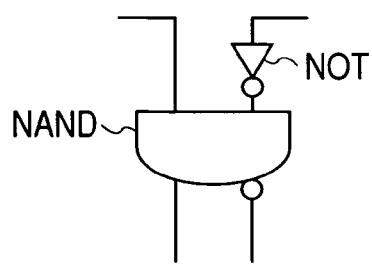
FIG. 26A is a circuit view of a gate pair according to a modification of the circuit shown in FIG. 10.
Figure 26B:
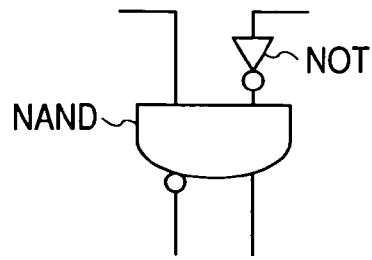
FIG. 26B is a circuit view of a gate pair according to a modification of the circuit shown in FIG. 11 and FIG. 24.

For example, the pulse selector 6a shown in FIG. 10 has a plurality of pairs of exclusive OR circuit XOR and inverter NOT. However, as shown in FIG. 26A, each pair of gates XOR and NOT may be replaced with a pair of inverter NOT and negative AND circuit NAND. Further, each of the pulse selector 61a and 64a shown in FIG. 11 and FIG. 24 has a plurality of pairs of exclusive negative OR circuit XNOR and inverter NOT However, as shown in FIG. 26B, each pair of gates XNOR and NOT may be replaced with a pair of inverter NOT and negative AND circuit NAND.

What is claimed is:

1. An analog-to-digital converter, comprising:
a pulse delay circuit, having M (M is an integer equal to or higher than two) delay units, that transmits a pulse signal through the delay units serially arranged and delays the pulse signal in each delay unit by a delay time corresponding to a level of an analog signal;
a data holding unit that latches the pulse signal delayed in each delay unit at N (N is an integer equal to or higher than two) sampling times to hold each of M×N values at M×N sampling points of the pulse signal as a piece of latched data; and
a converted data producing unit that receives the M×N pieces of latched data from the data holding unit as a single piece of combined data which is composed of the M×N latched data arranged in an order corresponding to an arranging order of the M×N sampling points in the pulse signal, and converts the combined data into numeral data, corresponding to a position of the pulse signal in the pulse delay circuit, at one time as converted digital data corresponding to the level of the analog signal.

2. The converter according to claim 1, wherein the data holding unit comprises:
a clock generating circuit that generates N sampling clocks specifying the respective sampling times; and
a plurality of data holding circuits, corresponding to the respective delay units of the pulse delay circuit, and each data holding circuit comprises:
N latch circuits that latch the pulse signal delayed in the corresponding delay unit in synchronization with the respective sampling clocks of the clock generating circuit to hold the N pieces of latched data.

3. The converter according to claim 1, wherein the data holding unit is configured to hold the M×N pieces of latched data every sampling period, and the converted data producing unit comprises:
a pulse selector and encoder that converts the combined data into the numeral data every sampling period;
a latch circuit that latches the numeral data of the pulse selector and encoder every sampling period and outputs the numeral data latched just before one sampling period; and
a data calculating circuit that produces the converted digital data from the numerical data held in the latch circuit and the numerical data outputted from the pulse selector and encoder.

4. The converter according to claim 1, wherein the combined data is expressed by a string of M×N bits such that the string is composed of a group of bits of first values or a bit of a first value and a group of bits of second values or a bit of a second value partitioned by a bit boundary, a pulse of the pulse signal being placed between two specific sampling points corresponding to two bits of different values facing each other with the bit boundary between, and
the converted data producing unit comprises:
a boundary specifying unit that specifying a position of the bit boundary in the combined data; and
a numeral data producing unit that produces the numeral data from the specified bit boundary.

5. An analog-to-digital converter, comprising:
a pulse delay circuit, having M (M is an integer equal to or higher than two) delay units, that transmits a pulse signal through the delay units serially arranged and delays the pulse signal in each delay unit by a delay time corresponding to a level of an analog signal;
a data holding unit that latches the pulse signal delayed in each delay unit at N (N is an integer equal to or higher than two) sampling times to hold each of M×N values at M×N sampling points of the pulse signal as a piece of latched data; and
a converted data producing unit that receives the M×N pieces of latched data from the data holding unit as a single piece of combined data which is composed of the M×N latched data arranged in an order corresponding to an arranging order of the M×N sampling points in the pulse signal, and converts the combined data into numeral data, corresponding to a position of the pulse signal in the pulse delay circuit, at one time as converted digital data corresponding to the level of the analog signal; wherein
the combined data is expressed by a string of M×N bits such that the top bit placed at a top bit position of the combined data corresponds to the sampling point of the pulse signal placed at the latest position of the pulse signal among the sampling points,
the converted data producing unit comprises:
a first inverter which inverts the top bit placed at a top bit position of the combined data into a first inverted output, the sampling point of the pulse signal corresponding to the top bit being placed at the latest position of the pulse signal among the sampling points;

M×N−1 exclusive OR circuits which perform exclusive OR operations for the combined data such that the exclusive OR circuit of a k-stage (k=1, 2, - - -, M×N−1) receives two bits placed at k-th and (k+1)-th bit positions of the combined data and outputs a non-inverted output indicating a result of the exclusive OR operation for the two bits, each exclusive OR circuit setting the non-inverted output at an active level when the received bits have different values, each exclusive OR circuit setting the non-inverted output at a non-active level when the received bits have the same value;

M×N−1 second inverters, corresponding to the respective exclusive OR circuits, each of which inverts the non-inverted output of the corresponding exclusive OR circuit into a second inverted output;

P output lines (P is determined by using a fraction Fx of $\log_2(M \times N)$ such that $P = \log_2(M \times N) + 1 - Fx$ for $Fx > 0$ or $P = \log_2(M \times N)$ for $Fx = 0$ is satisfied), each output line of a p-th (p=1, 2, - - -, P) stage corresponding to a p-th bit position in the numeral data;

a first switching circuit which performs a switching operation in response to the first inverted output of the first inverter to set the P output lines at a first voltage level when the bit received by the first inverter is set at a non-passing level; and M×N−1 second switching circuits, corresponding to the respective exclusive OR circuits and the respective second inverters, each of which performs a switching operation in response to the non-inverted output of the corresponding exclusive OR circuit and the second inverted output of the corresponding second inverter, the second switching circuit of a K-stage (K=1, 2, - - -, M×N−1) being configured, when the value K expressed by a particular bit string in binary notation has a bit of "1" at a particular bit position or bits of "1" at a plurality of particular bit positions, to set a particular output line of a particular stage corresponding to the particular bit position or a plurality of particular output lines of particular stages corresponding to the particular bit positions among the output lines at a second voltage level different from the first voltage level when the non-inverted output of the corresponding exclusive OR circuit is set at the active level and to set another output line or other output lines at the first voltage level when the non-inverted output of the corresponding exclusive OR circuit is set at the active level, and the numeral data is expressed by a bit or bits of "1" set at the particular bit position corresponding to the particular output line or the particular bit positions corresponding to the particular output lines and a bit or bits of "0" set at other bit positions corresponding to other output lines or another bit position corresponding to another output line.

6. An analog-to-digital converter, comprising:

a pulse delay circuit, having M (M is an integer equal to or higher than two) delay units, that transmits a pulse signal through the delay units serially arranged and delays the pulse signal in each delay unit by a delay time corresponding to a level of an analog signal;

a data holding unit that latches the pulse signal delayed in each delay unit at N (N is an integer equal to or higher than two) sampling times to hold each of M×N values at M×N sampling points of the pulse signal as a piece of latched data; and a converted data producing unit that receives the M×N pieces of latched data from the data holding unit as a single piece of combined data which is composed of the M×N latched data arranged in an order corresponding to an arranging order of the M×N sampling points in the pulse signal, and converts the combined data into numeral data, corresponding to a position of the pulse signal in the pulse delay circuit, at one time as converted digital data corresponding to the level of the analog signal; wherein each delay unit of the pulse delay circuit is configured to invert the pulse signal, the combined data is expressed by a string of M×N bits such that the top bit placed at a top bit position of the combined data corresponds to the sampling point of the pulse signal placed at the latest position of the pulse signal among the sampling points, the converted data producing unit comprises:

M×N−1 exclusive negative OR circuits which perform exclusive negative OR operations for the combined data such that the exclusive negative OR circuit of a k-stage (k=1, 2, - - -, M×N−1) receives two bits placed at k-th and (k+1)-th bit positions of the combined data and outputs a non-inverted output indicating a result of the exclusive negative OR operation for the two bits, each exclusive negative OR circuit setting the non-inverted output at an active level when the received bits have the same value, each exclusive negative OR circuit setting the non-inverted output at a non-active level when the received bits are set at different values;

M×N−1 inverters, corresponding to the respective exclusive OR circuits, each of which inverts the non-inverted output of the corresponding exclusive negative OR circuit into an inverted output;

P output lines (P is determined by using a fraction Fx of $\log_2(M \times N)$ such that $P = \log_2(M \times N) + 1 - Fx$ for $Fx > 0$ or $P = \log_2(M \times N)$ for $Fx = 0$ is satisfied), each output line of a p-th (p=1, 2, - - -, P) stage corresponding to a p-th bit position in the numeral data;

a first switching circuit which performs a switching operation in response to the bit placed at a top bit position of the combined data into a first inverted output to set the P output lines at a first voltage level when the bit is set at a non-passing level; and M×N−1 second switching circuits, corresponding to the respective exclusive negative OR circuits and the respective inverters, each of which performs a switching operation in response to the non-inverted output of the corresponding exclusive negative OR circuit and the inverted output of the corresponding inverter, each second switching circuit of a K-stage (K=1, 2, - - -, MXN−1) being configured, when the value K expressed by a particular bit string in binary notation has a bit or bits of "1" at a particular bit position or a plurality of particular bit positions, to set a particular output line of a particular stage corresponding to the particular bit position or a plurality of particular output lines of particular stages corresponding to the particular bit positions among the output lines at a second voltage level different from the first voltage level when the non-inverted output of the corresponding exclusive negative OR circuit is set at the active level and to set another output line or other output lines at the first voltage level when the non-inverted output of the corresponding exclusive OR circuit is set at the active level, and the numeral data is expressed by a bit or bits of "1" set at the particular bit position corresponding to the particular output line or the particular bit positions corresponding to the particular output lines and a bit or bits of "0" set at other bit positions corresponding to other output lines or another bit position corresponding to another output line.

7. The converter according to claim 1, wherein the data holding unit has a plurality of data holding circuits corresponding to the delay units of the pulse delay circuit, and each data holding circuit comprises:
N delay elements that delay the pulse signal outputted from the corresponding delay unit to produce N delayed signals of which phases are differentiated from one another by intervals equal to those of the N sampling times; and
N latch circuits that, respectively, latch the N delayed signals of the delay elements in synchronization with a reference clock to hold the N values as the N pieces of latched data.

8. The converter according to claim 7, wherein the delay elements have respective inverters having different threshold values.

9. The converter according to claim 1, wherein the converted data producing unit has
a correcting circuit that corrects a bit of the combined data to produce corrected data from the combined data, the converted data producing unit producing the numeral data from the corrected data.

10. An analog-to-digital converter, comprising:
a pulse delay circuit, having M (M is an integer equal to or higher than two) delay units, that transmits a pulse signal through the delay units serially arranged and delays the pulse signal in each delay unit by a delay time corresponding to a level of an analog signal;
a data holding unit that latches the pulse signal delayed in each delay unit at N (N is an integer equal to or higher than two) sampling times to hold each of M×N values at M×N sampling points of the pulse signal as a piece of latched data; and
a converted data producing unit that receives the M×N pieces of latched data from the data holding unit as a single piece of combined data which is composed of the M×N latched data arranged in an order corresponding to an arranging order of the M×N sampling points in the pulse signal, and converts the combined data into numeral data, corresponding to a position of the pulse signal in the pulse delay circuit, at one time as converted digital data corresponding to the level of the analog signal;
wherein the converted data producing unit has
a correcting circuit that corrects a bit of the combined data to produce corrected data from the combined data, the converted data producing unit producing the numeral data from the corrected data; and
the correcting circuit comprises:
a first correcting circuit that produces first corrected data from the combined data by extracting each of bits of the combined data as a specific bit to be checked, and changing the specific bit set at a first level, indicating that a pulse of the pulse signal has already passed, to a first corrected bit set at a second level, indicating that the pulse of the pulse signal has not yet passed, when two reference bits placed away from the specific bit by two bit positions toward respective upper and lower sides of the specific bit are set at the second level together, and
a second correcting circuit that produces second corrected data from the first corrected data by
extracting each of bits of the first corrected data as a specific bit to be checked, and
changing the specific bit set at the first level to a second corrected bit set at the second level when two reference bits adjacent to the specific bit are set at the second level together, the converted data producing unit producing the numeral data from the second corrected data.

11. An analog-to-digital converter, comprising:
a pulse delay circuit, having M (M is an integer equal to or higher than two) delay units, that transmits a pulse signal through the delay units serially arranged and delays the pulse signal in each delay unit by a delay time corresponding to a level of an analog signal;
a data holding unit that latches the pulse signal delayed in each delay unit at N (N is an integer equal to or higher than two) sampling times to hold each of M×N values at M×N sampling points of the pulse signal as a piece of latched data; and
a converted data producing unit that receives the M×N pieces of latched data from the data holding unit as a single piece of combined data which is composed of the M×N latched data arranged in an order corresponding to an arranging order of the M×N sampling points in the pulse signal, and converts the combined data into numeral data, corresponding to a position of the pulse signal in the pulse delay circuit, at one time as converted digital data corresponding to the level of the analog signal;
wherein the converted data producing unit has
a correcting circuit that corrects a bit of the combined data to produce corrected data from the combined data, the converted data producing unit producing the numeral data from the corrected data; and
the correcting circuit is adapted to produce the corrected data from the combined data by
extracting each of bits of the combined data as a specific bit to be checked, and
changing the specific bit set at a first level, indicating that a pulse of the pulse signal has already passed, to a corrected bit set at a second level, indicating that the pulse of the pulse signal has not yet passed, when two reference bits adjacent to the specific bit are set at the second level together.

12. The converter according to claim 1, wherein
the pulse delay circuit is configured to connect the delay units in a ring shape so as to repeatedly circulate the pulse signal through the delay units,
the converter further comprises:
a circulation number counter that counts a circulation number of the pulse signal circulated in the pulse delay circuit, and
the converted data producing unit is configured to calculate the numeral data from the combined data and the circulation number.

13. An analog-to-digital converter, comprising:
L (L is an integer equal to or higher than two) core units, each core unit comprising:
a pulse delay circuit, having M (M is an integer equal to or higher than two) delay units, that transmits a pulse signal through the delay units serially arranged and delays the pulse signal in each delay unit by a delay time corresponding to a level of an analog signal;
a data holding unit that latches the pulse signal delayed in each delay unit at N (N is an integer equal to or higher than two) sampling times to hold each of M×N values at M×N sampling points of the pulse signal as a piece of latched data; and
a converted data producing unit that receives the M×N pieces of latched data from the data holding unit as a single piece of combined data composed of the latched data arranged in an order corresponding to an arranging order of the M×N sampling points in the pulse signal, converts the combined data into numeral data, corresponding to a position of the pulse signal in the pulse delay circuit, at one time as converted digital data corresponding to the level of the analog signal; and
an adder circuit that calculates a sum of the pieces of converted digital data obtained in the core units as final converted digital data corresponding to the level of the analog signal.

14. The converter according to claim 13, wherein the converted data producing unit is configured to receive the M×N pieces of latched data every sampling period, and
the adder circuit comprises:
a plurality of adder units, arranged in a binary tree structure of P ($L=2^P$) stages so as to arrange $2^{P-k}$ (k is an integer ranging from 1 to P) adder units among the adder units in parallel to one another on the k-stage; and
an adder clock generating circuit that generates P adder clocks specifying P latching times at predetermined delay time intervals every sampling period such that each delay time interval is shorter than the sampling period and outputs the P adder clocks to the adder units of the respective stages such that the latching time of the latch circuits on the k-th stage is later than the latching time of the latch circuits on the (k−1)-th stage,
each of the adder units arranged on the k-stage having:
an adder that calculates a sum of two pieces of converted digital data received from two adder units of the (k−1)-stage; and
a latch circuit that latches the sum calculated in the adder in synchronization with the corresponding adder clock and outputs the latched sum to one adder of the (k+1)-th stage as converted digital data.

15. The converter according to claim 13, wherein the delay units in each core unit are configured to have the delay time of which a value differs from values of the delay times in the other core units.

16. The converter according to claim 13, wherein the group of sampling times in the data holding unit of each core unit is set to be differentiated from the groups of sampling times in the data holding units of the other core units.

17. An analog-to-digital converter, comprising:
a pulse delay circuit, having M (M is an integer equal to or higher than two) delay units, that transmits a pulse signal through the delay units serially arranged and delays the pulse signal in each delay unit by a delay time corresponding to a level of an analog signal;
N (N is an integer equal to or higher than two) coding circuits, wherein each coding circuit latches M outputs of the delay units at one of N sampling times every sampling period to hold M values at M sampling points of the M outputs as M pieces of latched data, calculates numeral data corresponding to a position of the pulse signal in the pulse delay circuit from a single piece of combined data, which is composed of the M latched data arranged in an order corresponding to an arranging order of the M sampling points in the pulse signal, at one time as converted digital data corresponding to the level of the analog signal every sampling period; and
an adding circuit that calculates a sum of the pieces of converted digital data produced in the coding circuits as final converted digital data, corresponding to the level of the analog signal, every sampling period, the adding circuit comprising:
a plurality of adder units arranged in a binary tree structure of P ($N=2^P$) stages such that $2^{P-k}$ (k is an integer ranging from 1 to P) adder units among the adder units are arranged in parallel to one another on the k-stage, wherein each of the adder units arranged on the k-stage has
an adder that calculates a sum of two pieces of converted digital data received from two adder units of the (k−1)-stage, and
a latch circuit that latches the sum calculated in the adder and outputs the latched sum to one adder of the (k−1)-th stage as converted digital data; and
an adder clock generating circuit that generates P adder clocks specifying P latching times at predetermined delay time intervals every sampling period, such that each delay time interval is shorter than the sampling period, and supplies the adder clocks to the latch circuits such that the latch circuits of each stage perform latching operations in synchronization with one of the adder clocks and such that the latching time in the k-th stage is later than the latching time in the (k−1)-th stage by one delay time interval.

18. The converter according to claim 17, wherein each delay time interval is set to be equal to or longer than a calculation delay time which indicates a period of time required by a signal passing through a critical path of any adder unit.

19. The converter according to claim 17, wherein
the pulse delay circuit is configured to connect the delay units in a ring shape so as to repeatedly circulate the pulse signal through the delay units,
the converter further comprises:
a circulation number counter that counts a circulation number of the pulse signal circulated in the pulse delay circuit, and
each of the coding circuits is configured to calculate the corresponding numeral data from the combined data and the circulation number.

* * * * *